(12) United States Patent
White

(10) Patent No.: US 7,030,704 B2
(45) Date of Patent: Apr. 18, 2006

(54) METHOD AND APPARATUS FOR A SOLID-STATE ATOMIC FREQUENCY STANDARD

(75) Inventor: Christopher White, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 15 days.

(21) Appl. No.: 10/929,100

(22) Filed: Aug. 26, 2004

(65) Prior Publication Data

US 2005/0088248 A1 Apr. 28, 2005

Related U.S. Application Data

(60) Provisional application No. 60/497,793, filed on Aug. 26, 2003.

(51) Int. Cl.
*H03L 7/26* (2006.01)

(52) U.S. Cl. .......................................... 331/3; 331/94.1
(58) Field of Classification Search ................ 331/3, 331/94.1
See application file for complete search history.

(56) References Cited

U.S. PATENT DOCUMENTS

| | | | |
|---|---|---|---|
| 5,397,988 A * | 3/1995 | Schmalbein et al. | 324/316 |
| 6,255,647 B1 | 7/2001 | Vanier et al. | |
| 6,265,945 B1 | 7/2001 | Delaney et al. | |
| 6,426,679 B1 | 7/2002 | Oblak et al. | |

* cited by examiner

*Primary Examiner*—David Mis
(74) *Attorney, Agent, or Firm*—Tope-McKay & Associates

(57) ABSTRACT

The present invention relates generally to frequency standards. More specifically, the present invention relates to a method and apparatus for solid-state atomic frequency standard based on the hyperfine spectrum of paramagnetic dopants in solids.

63 Claims, 13 Drawing Sheets

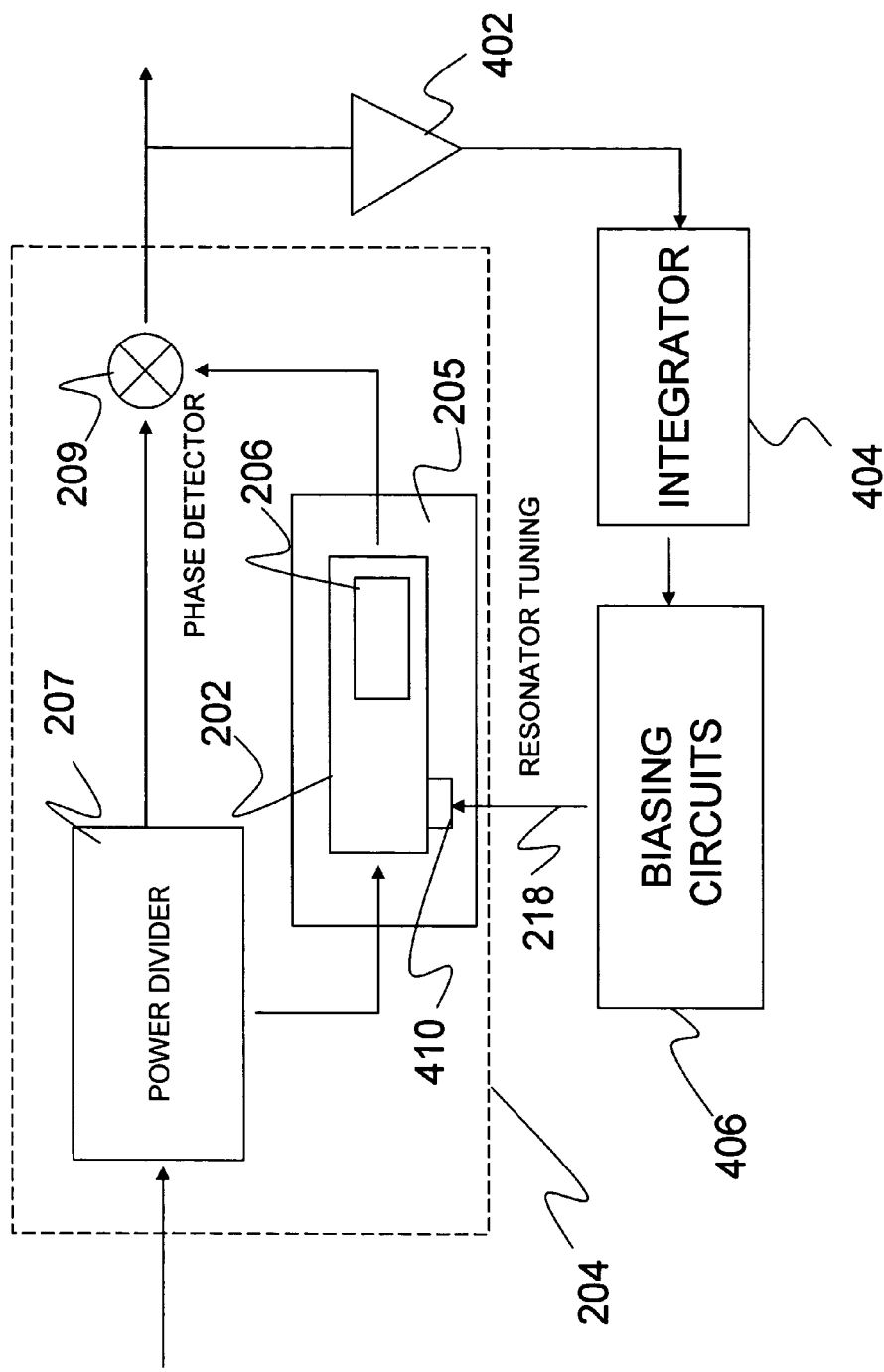
FIG. 4 RESONATOR FREQUENCY CONTROL

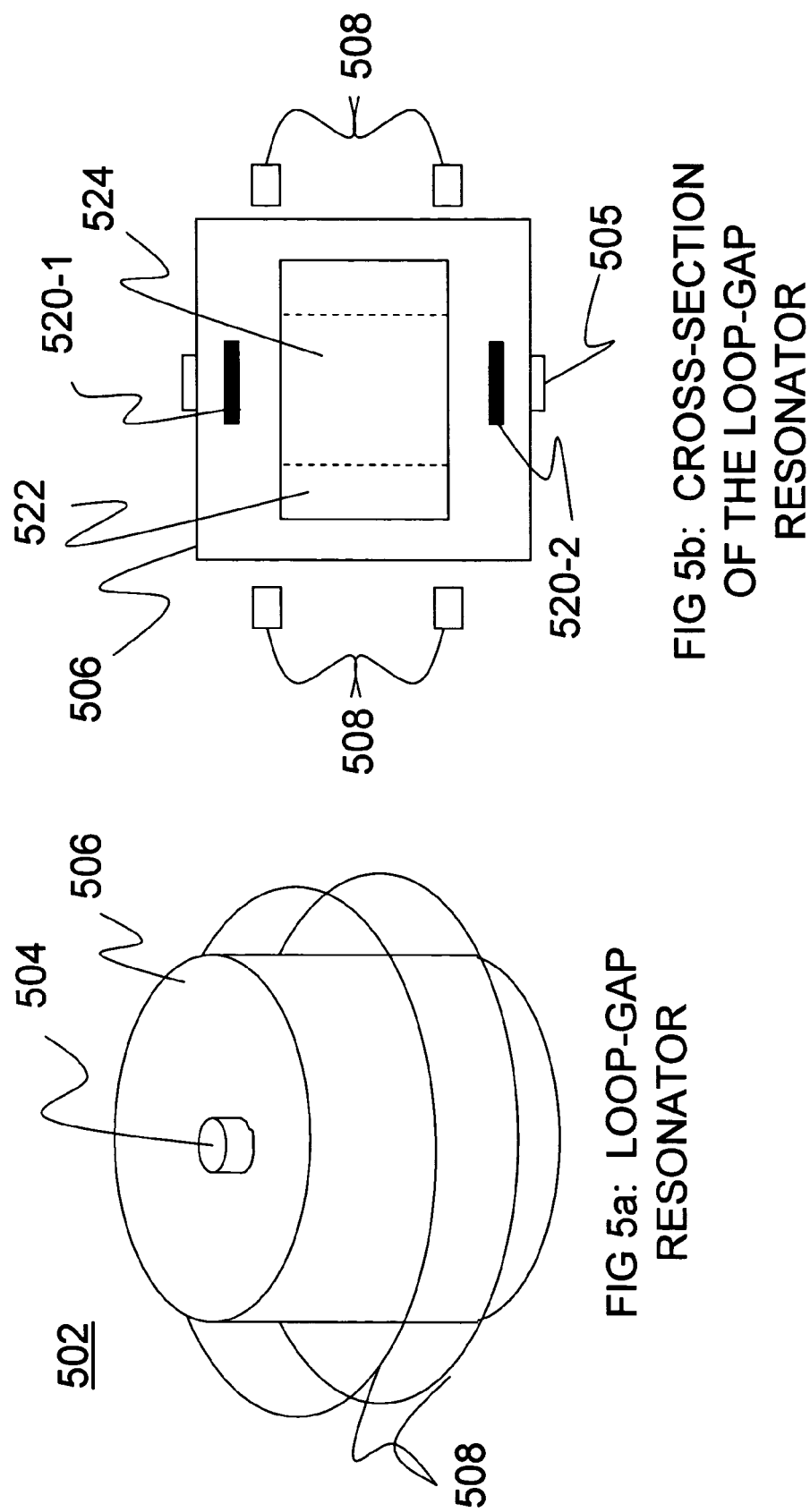
FIG 5b: CROSS-SECTION OF THE LOOP-GAP RESONATOR
FIG 5a: LOOP-GAP RESONATOR

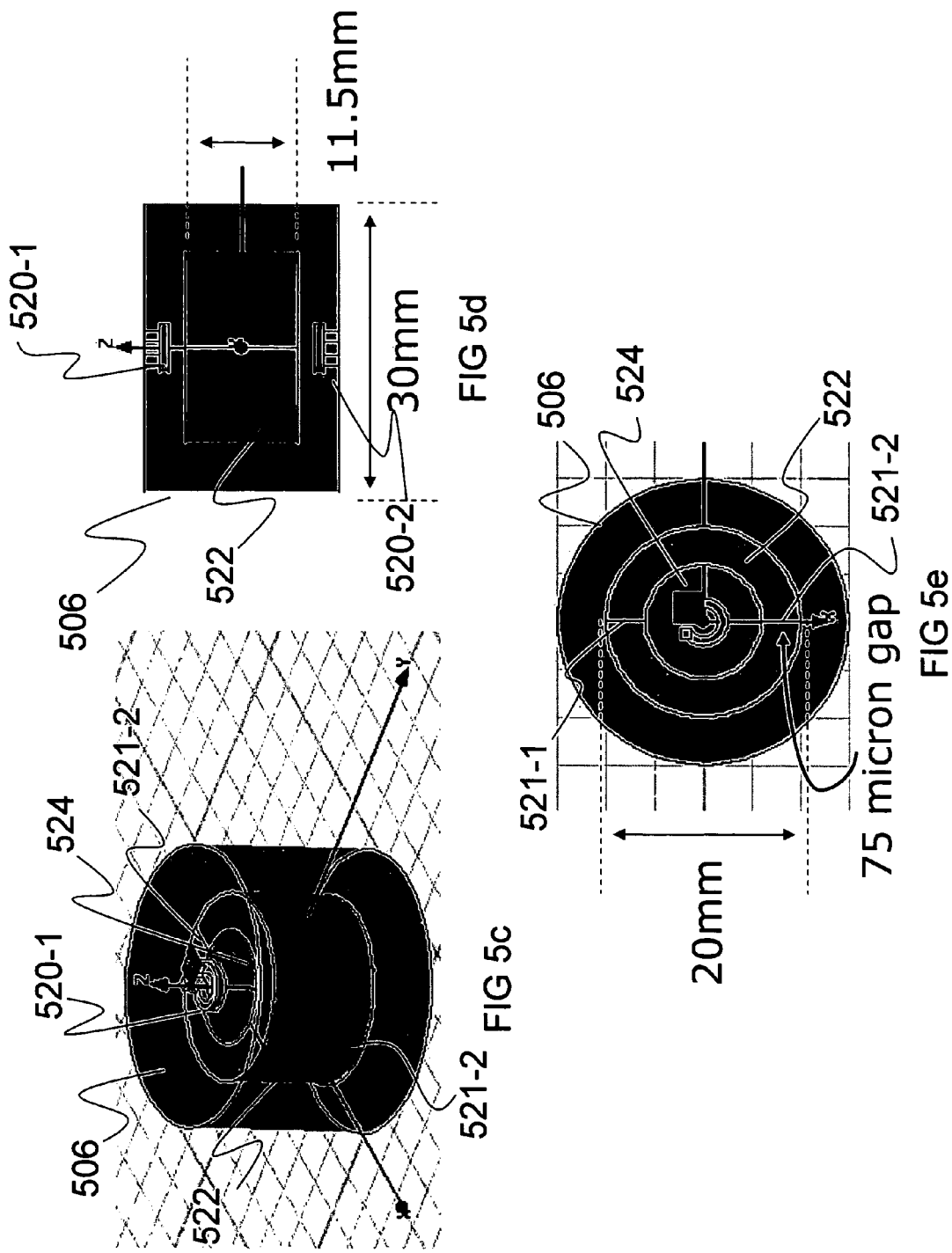

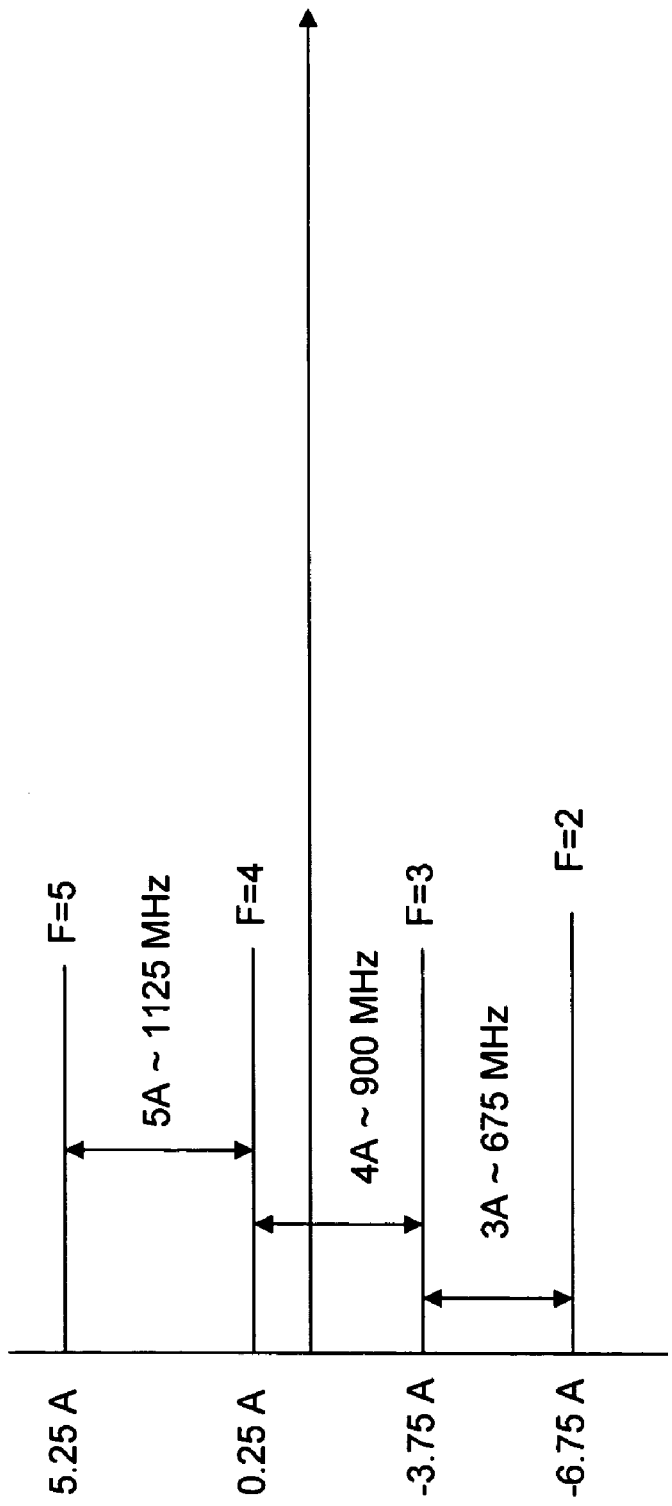
FIG. 7 – Zero Field Transitions of Vanadium Doped Magnesium Oxide

FIG 8a: COAXIAL RESONATOR

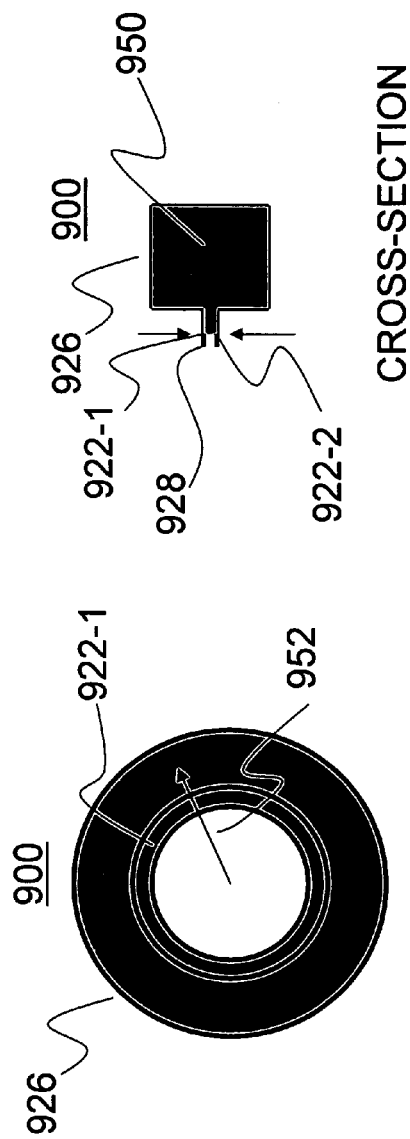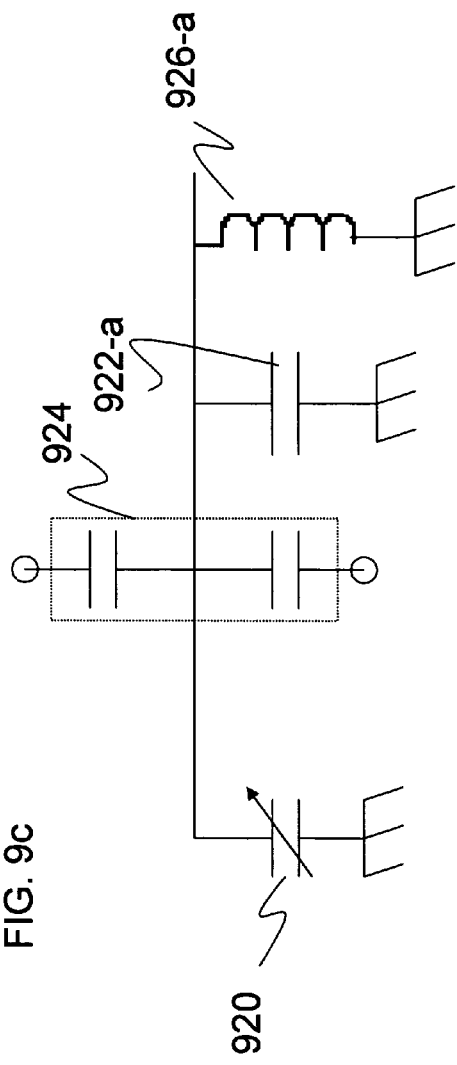
FIG. 9d CROSS-SECTION
FIG. 9c TOP VIEW
FIG. 9e TOROIDAL RF RESONATOR

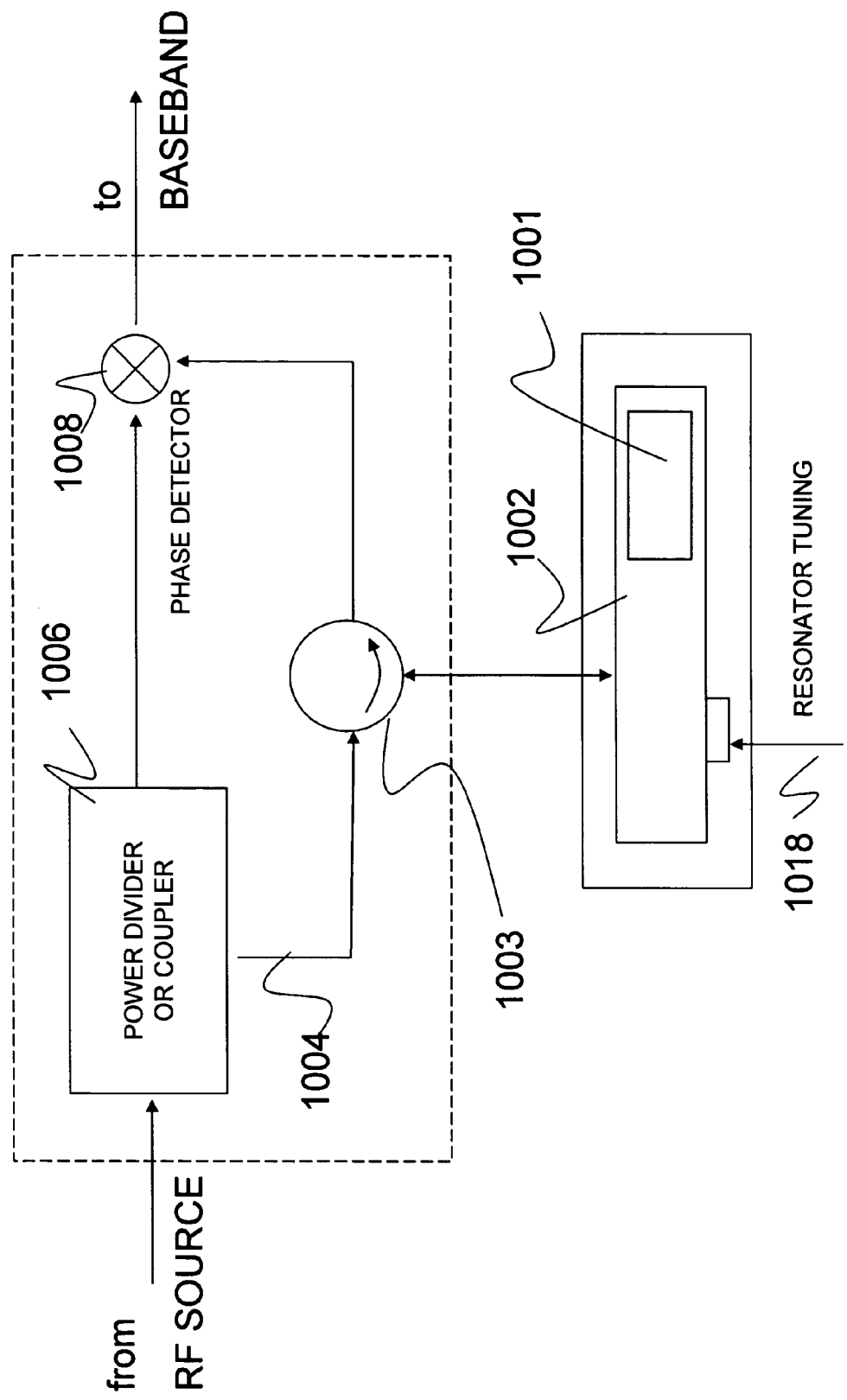
FIG. 10 REFLECTION DESIGN

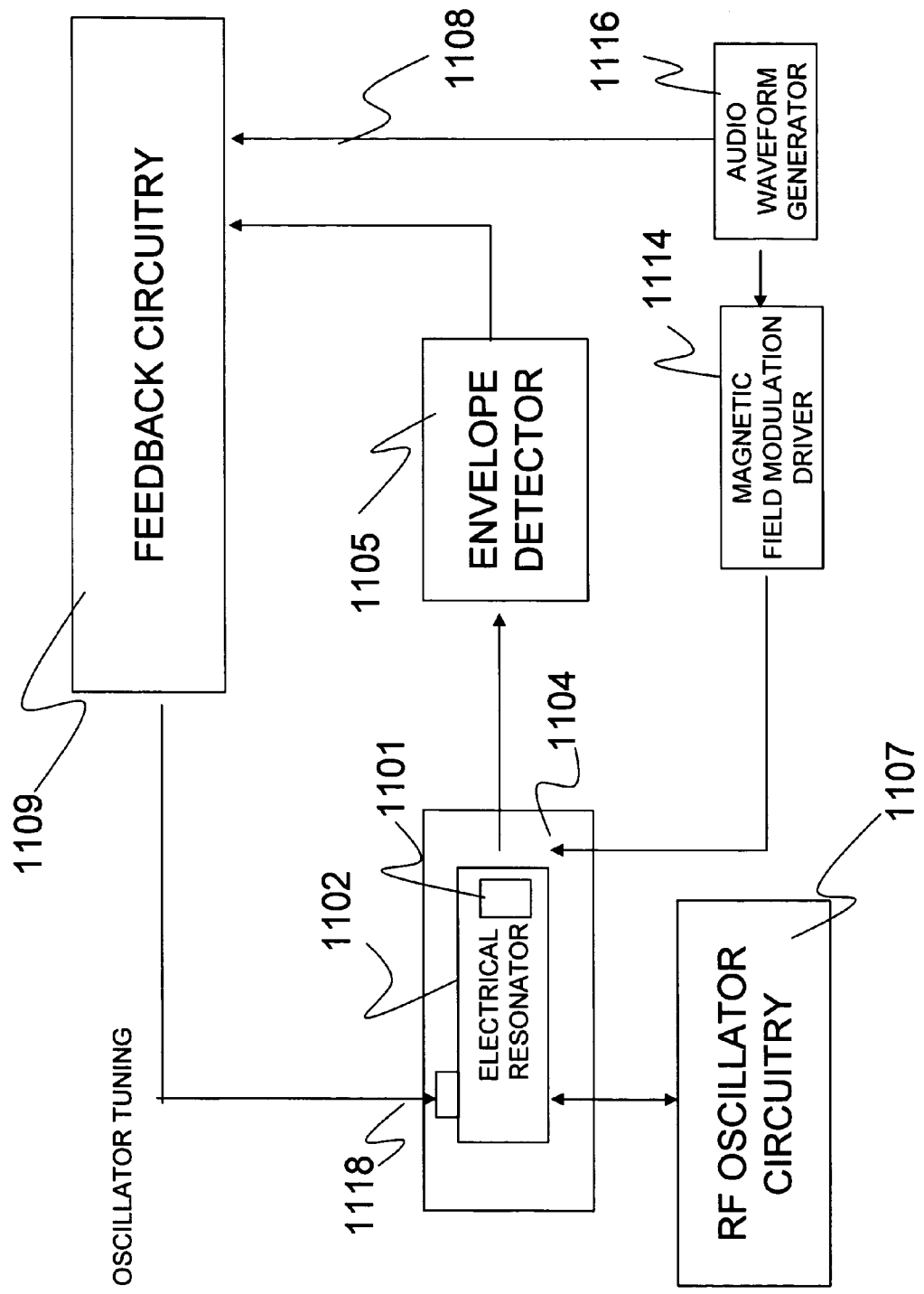
FIG. 11 LOCK-IN MARGINAL OSCILLATOR DESIGN

METHOD AND APPARATUS FOR A SOLID-STATE ATOMIC FREQUENCY STANDARD

PRIORITY CLAIM

The present application claims the benefit of priority of U.S. Provisional Patent Application No. 60/497,793, filed Aug. 26, 2003, entitled "Solid-State Atomic Frequency Standard."

BACKGROUND (1) Technical Field

The present invention relates generally to frequency standards. More specifically, the present invention relates to a method and apparatus for a solid-state atomic frequency standard based on the hyperfine spectrum of paramagnetic dopants in solids.

(2) Background

Frequency standards are important in nearly all electronic systems, and are widely used in cellular telephones, wireless networks, satellite broadcasting, fiber-optic communication, global positioning systems (GPS), and a variety of general applications such as frequency synthesizers. Crystal oscillators are traditionally used as frequency standards and timing functions in all but the most demanding applications which demand precise accuracy. In addition to high accuracy, aging is also an important limitation of crystal oscillators in high-precision applications. Therefore, in demanding applications, atomic clocks, such as rubidium standards, may be used.

The cost of many high-volume electronic systems has dropped dramatically in the last several decades as greater functionality has been integrated onto a single chip. As a result, crystal oscillators are now one of the largest and most expensive components in many systems. Therefore, frequency standards with lower cost, smaller size, or better performance than the prior art have many uses.

This disclosure describes a new frequency standard. Previously, there were two classes of frequency standards: atomic clocks and crystal oscillators. In a crystal oscillator, the resonant frequency depends primarily on the precise cut, mass, and dimensions of the crystal resonator. There are various, common techniques for stabilizing frequency over temperature, such as temperature-compensated crystal oscillators (TCXOs), digitally-compensated crystal oscillators (DCXOs), time-compensated clock oscillators (TCCOs), oven-controlled crystal oscillators (OCXOs), and others known to those familiar with the art. However, the resonator need not be made of a crystal such as quartz; instead an oscillator using a surface acoustic wave (SAW) resonator or bulk acoustic wave (BAW) resonator might be used as a frequency reference in some applications. These resonators can be made from piezoelectric materials such as zinc oxide, aluminum nitride, polysilicon and others. The operating principle, however, is the same in all cases; e.g. the initial frequency is set by the mechanical dimensions of the piezoelectric resonator, and the resonant frequency is stabilized over environmental variations using techniques such as temperature compensation, as mentioned above. Also, in some cases it is desired to "pull" the oscillator to a more useful or repeatable frequency, by using a varactor in parallel with the piezoelectric resonator or by other means.

Atomic clocks derive a frequency from the quantum mechanical transitions of an ensemble of atoms or ions in the gas phase. Examples range from primary standards such as the cesium beam atomic clock, to smaller clocks such as rubidium standards. Usually, a technique is devised to interrogate the frequency of the magnetic dipole transitions between the hyperfine states of a particular atom or ion vapor, although a standard based on an optical (i.e., electric dipole) transition has been recently implemented. Rubidium standards can be implemented using optical pumping or coherent population trapping to interrogate the hyperfine splitting of the rubidium ions. Regardless of the implementation, the desired frequency is derived from the atomic spectrum of a gas of atoms or ions, rather than from the mechanical dimensions and mass of a piezoelectric resonator. Further details of conventional, miniature atomic clocks may be found in the following references, each of which is incorporated herein by reference:

{1} U.S. Pat. No. 6,426,679, entitled "Miniature, Low Power Atomic Frequency Standard with Improved RF Frequency Synthesizer," Jul. 30, 2002;

{2} "Coherent Population Trapping for the Realization of a Small, Stable, Atomic Clock," Jaques Vanier, 2002 IEEE International Frequency Control Symposium and PDA Exhibition, pp. 424–434;

{3} "Performance of Small Scale Frequency Reference," J. Kitching, S. Knappe and L. Holberg, 2002 IEEE International Frequency Control Symposium and PDA Exhibition, pp. 442–446;

{4} U.S. Pat. No. 6,265,945 "Atomic Frequency Standard Based on Coherent Population Trapping," Jul. 24, 2001; and {5} U.S. Pat. No. 6,255,647 "Atomic Frequency Standard Based on Coherent State Preparation," Jul. 3, 2001.

The following articles describe the frequency stability of passive atomic frequency standards, and are incorporated herein by reference: Jacques Vanier and Laurent-Guy Bernier, "On the Signal-to-Noise and Short-Term Stability of Passive Rubidium Frequency Standards," IEEE Transactions on Instrumentation and Measurements, (1981), IM-30, 277; Jacques Vanier, Michel Tetu, Laurent-Guy Bernier, "Transfer of Frequency Stability from an Atomic Reference to a Quartz-Crystal Oscillator," IEEE Transactions on Instrumentation and Measurements, (1979), IM-28, 188; James A. Barnes, et al., "Characterization of Frequency Stability," IEEE Transactions on Instrumentation and Measurements, (1971), 20, 105.

(3) Description of Related Art

Several patents are described below, which may provide further useful background material to the reader: U.S. Pat. No. 6,570,459, issued May 27, 2003, to Nathanson et al., discloses a physics package apparatus for an atomic clock. The physics package, containing a cesium or rubidium vapor, laser diode, collimating optics, photodetector, microwave resonator, and heating elements, is batch fabricated using laminated layers of etched borosilicate glass.

U.S. Pat. No. 6,133,800, issued Oct. 17, 2000, to Jinquan Deng, discloses a subminiature microwave cavity which is used to implement a small and inexpensive physics package for an atomic clock. The cavity is a variation on a capacitive-loaded coaxial resonator.

U.S. Pat. No. 4,803,624, issued Feb. 7, 1989, to Pilbrow et al., discloses a portable electron spin resonance spectrometer.

U.S. Pat. No. 3,548,298, issued Dec. 15, 1970, to M. S. Adler, discloses a transistorized nuclear magnetic resonance gaussmeter. The gaussmeter is a lock-in nuclear magnetic resonance gaussmeter, i.e. a system is disclosed to servo the frequency of a RF source to the frequency of a nuclear magnetic resonance absorption.

SUMMARY OF THE INVENTION

The present invention provides a method and apparatus that overcomes the aforementioned limitations and fills the aforementioned needs by providing a frequency standard that derives the reference frequency from the hyperfine spectrum of paramagnetic ions in solids.

In one aspect of the invention, frequency standard comprising: a RF source having an RF signal output; RF circuitry coupled with the RF source, the RF circuitry having a solid dielectric which has an electron paramagnetic resonance and the RF circuitry providing a compared output signal; and feedback circuitry coupled with the RF circuitry and the RF source, the feedback circuitry providing an error signal, whereby the RF circuitry receives the RF signal output and compares the RF signal output to the electron paramagnetic resonance and generates a compared output signal, and the feedback circuitry receives the compared output signal and provides the error signal to the RF source and the RF source adjusts the RF signal output based on the error signal.

In another aspect, the electron paramagnetic resonance is a zero-field electron paramagnetic resonance.

In yet another aspect, the zero-field electron paramagnetic resonance is formed via transitions of metal ions in the solid dielectric.

In yet another aspect, the transitions of metal ions are hyperfine transitions.

In yet another aspect, the solid dielectric is vanadium doped magnesium oxide.

In yet another aspect, the vanadium magnesium oxide is a single crystal or an amphorous crystal.

In yet another aspect, the RF circuitry comprises: a power divider coupled with the RF source having a first output and a second output; an electrical resonator having the solid dielectric and an output, the electrical resonator coupled with the second output of the power divider; a phase detector coupled with the first output of the power divider and the output of the electrical resonator, whereby the phase detector generates the compared output signal.

In yet another aspect, the electrical resonator is selected from the group consisting of: a loop-gap resonator; a coaxial resonator and a toroidal resonator.

In yet another aspect, the electrical resonator is a toroidal resonator comprising: an outer conductor; and a toroidal inductor within the outer conductor, wherein the solid dielectric makes up a portion of the toroidal inductor.

In yet another aspect, the toroidal resonator further comprises modulation coils surrounding the toroidal inductor.

In yet another aspect, the toroidal resonator further comprises a capacitive element coupled with the toroidal inductor.

In yet another aspect, the capacitive element is formed from a top electrode and a bottom electrode coupled with the toroidal inductor.

In yet another aspect, modulation coils are included for applying a magnetic field to the solid dielectric, wherein the electron paramagnetic resonance transitions has frequencies, whereby the magnetic field modulates the frequencies of the electron paramagnetic resonance transitions.

In yet another aspect, a magnetic field modulation driver is included for controlling the magnetic field.

In yet another aspect, the feedback circuitry comprises an audio demodulator for demodulating the modulation introduced by the magnetic field.

In yet another aspect, the phase detector is a double-balanced mixer.

In yet another aspect, the RF circuitry comprises: power divider coupled with the RF source, the power divider having a first output port and a second output port; a circulator coupled with the second output port; an electrical resonator having the solid dielectric, coupled with the circulator; and a phase detector coupled with the circulator and the first output port of the power divider.

In yet another aspect, the RF source comprises: RF oscillator circuitry; and an electrical resonator connected with the RF oscillator circuitry; and the RF circuitry comprises an envelope detector coupled with the electrical resonator and the feedback circuitry.

In another aspect, the invention comprises a method for obtaining a standard frequency. The method comprises acts of receiving an RF signal; comparing the RF signal to an electron paramagnetic resonance from a solid dielectric having paramagnetic species; adjusting the RF signal to the electron paramagnetic resonance; and outputting the adjusted RF signal, whereby the adjusted RF signal is at a standard frequency determined by the electron paramagnetic resonance.

In another aspect of the method, the act of comparing includes an act of utilizing a zero-field electron paramagnetic resonance.

In still another act of the method, the act of utilizing further comprises an act of generating magnetic dipole transitions between spin states of metal ions in the solid dielectric.

In a further aspect of the method, the act of generating includes hyperfine transitions.

In a still further aspect of the method, the act of comparing further includes an act of comparing the RF signal to the electron paramagnetic resonance from a vanadium doped magnesium oxide solid dielectric.

In yet another aspect of the method, the present invention further comprises an act of proving the vanadium doped magnesium oxide solid dielectric from a single crystal or an amphorous crystal.

In still another aspect, the method further includes acts of dividing the RF signal into a first RF signal and a second RF signal; changing the second RF signal based upon the electron paramagnetic resonance and outputting a changed second RF signal; and generating an error signal based on the difference between the first RF signal and the changed second RF signal, wherein the error signal is used in the adjusting act.

In a yet further aspect of the method, the act of changing the second RF signal is performed by an electrical resonator having the solid dielectric selected from the group consisting of: a loop-gap resonator; a coaxial resonator; and a toroidal resonator.

In further aspect of the method, the act of changing the second RF signal further comprises acts of: forming a toroidal inductor from the solid dielectric having the electron paramagnetic resonance; and coupling the second RF signal into the toroidal inductor.

In another aspect of the method, the act of changing the second RF signal further comprises an act of modulating a magnetic field of the toroidal inductor.

In yet another aspect of the method, the act of changing the second RF signal further comprises an act of coupling a capacitive element with the toroidal inductor.

In a still further aspect of the method, the act of coupling further comprises an act of forming a top electrode and a bottom electrode attached with the toroidal inductor.

In a further aspect of the method, the method further comprises acts of: applying a magnetic field to the solid dielectric; and modulating, via the magnetic field, frequencies of the electron paramagnetic resonance transitions in the solid dielectric.

In a still further aspect, the method further comprises an act of demodulating the modulation introduced by the magnetic field.

In another aspect, the present invention comprises a method for obtaining a frequency comprising acts of: receiving an RF signal; comparing the RF signal to a zero-field electron paramagnetic resonance from a solid dielectric having a paramagnetic species; adjusting the RF signal to the zero-field electron paramagnetic resonance; and outputting the adjusted RF signal, whereby the adjusted RF signal is at a standard frequency determined by the zero-field electron paramagnetic resonance.

In still another aspect, the act of comparing includes comparing the RF signal to the zero-field electron paramagnetic resonance formed from hyperfine transitions.

In yet another aspect, the act of comparing further includes an act of comparing the RF signal to the electron paramagnetic resonance from a vanadium doped magnesium oxide solid dielectric.

In a further aspect, the invention further comprises an act of proving the vanadium doped magnesium oxide solid dielectric from a single crystal or an amphorous crystal.

In a still further aspect, the act of comparing further includes acts of: dividing the RF signal into a first RF signal and a second RF signal; changing the second RF signal based upon the zero-field electron paramagnetic resonance and outputting a changed second RF signal; and generating an error signal based on the difference between the first RF signal and the changed second RF signal, wherein the error signal is used in the adjusting act.

In a yet further aspect, the act of changing the second RF signal is performed by an electrical resonator having the solid dielectric selected from the group consisting of: a loop-gap resonator; a coaxial resonator; and a toroidal resonator.

In yet another aspect, the act of changing the second RF signal further comprises acts of: forming a toroidal inductor from the solid dielectric having the zero-field electron paramagnetic resonance; and coupling the second RF signal into the toroidal inductor.

In another aspect, the act of changing the second RF signal further comprises an act of modulating a magnetic field of the toroidal inductor.

In a further aspect, the act of changing the second RF signal further comprises an act of coupling a capacitive element with the toroidal inductor.

In a still further aspect, the act of coupling further comprises an act of forming a top electrode and a bottom electrode attached with the toroidal inductor.

In another aspect, the method further comprises acts of: applying a magnetic field to the solid dielectric; and modulating, via the magnetic field, frequencies of the electron paramagnetic resonance transitions in the solid electric.

In a further aspect, the method further comprises an act of demodulating the modulation introduced by the magnetic field.

BRIEF DESCRIPTION OF THE DRAWINGS

The objects, features and advantages of the present invention will be apparent from the following detailed descriptions of the preferred aspects of the invention in conjunction with reference to the following drawings.

FIG. 4 illustrates one embodiment of a resonator tuning loop in accordance with the present invention;

FIG. 5a depicts a sketch of a loop-gap resonator in accordance with the present invention;

FIG. 5b illustrates a cross-section of the loop-gap resonator in accordance with the present invention;

FIG. 5c illustrates a three-dimensional drawing of the loop-gap resonator in accordance with the present invention;

FIG. 5d illustrates a cross-section of the loop-gap resonator in accordance with the present invention;

FIG. 5e illustrates a top view of the loop-gap resonator in accordance with the present invention;

FIG. 7 depicts zero-field transitions of vanadium doped magnesium oxide.

FIG. 8a depicts a coaxial resonator in accordance with the present invention;

FIG. 9c shows a second top view of the toroidal resonator in accordance with the present invention;

FIG. 9d shows a second cross-section of the toroidal resonator in accordance with the present invention;

FIG. 9e depicts an electrical model of the toroidal resonator in accordance with the present invention;

FIG. 10 depicts another embodiment of the frequency standard in accordance with the present invention; and FIG. 11 depicts yet another embodiment of the frequency standard in accordance with the present invention.

DETAILED DESCRIPTION

Figure 1:
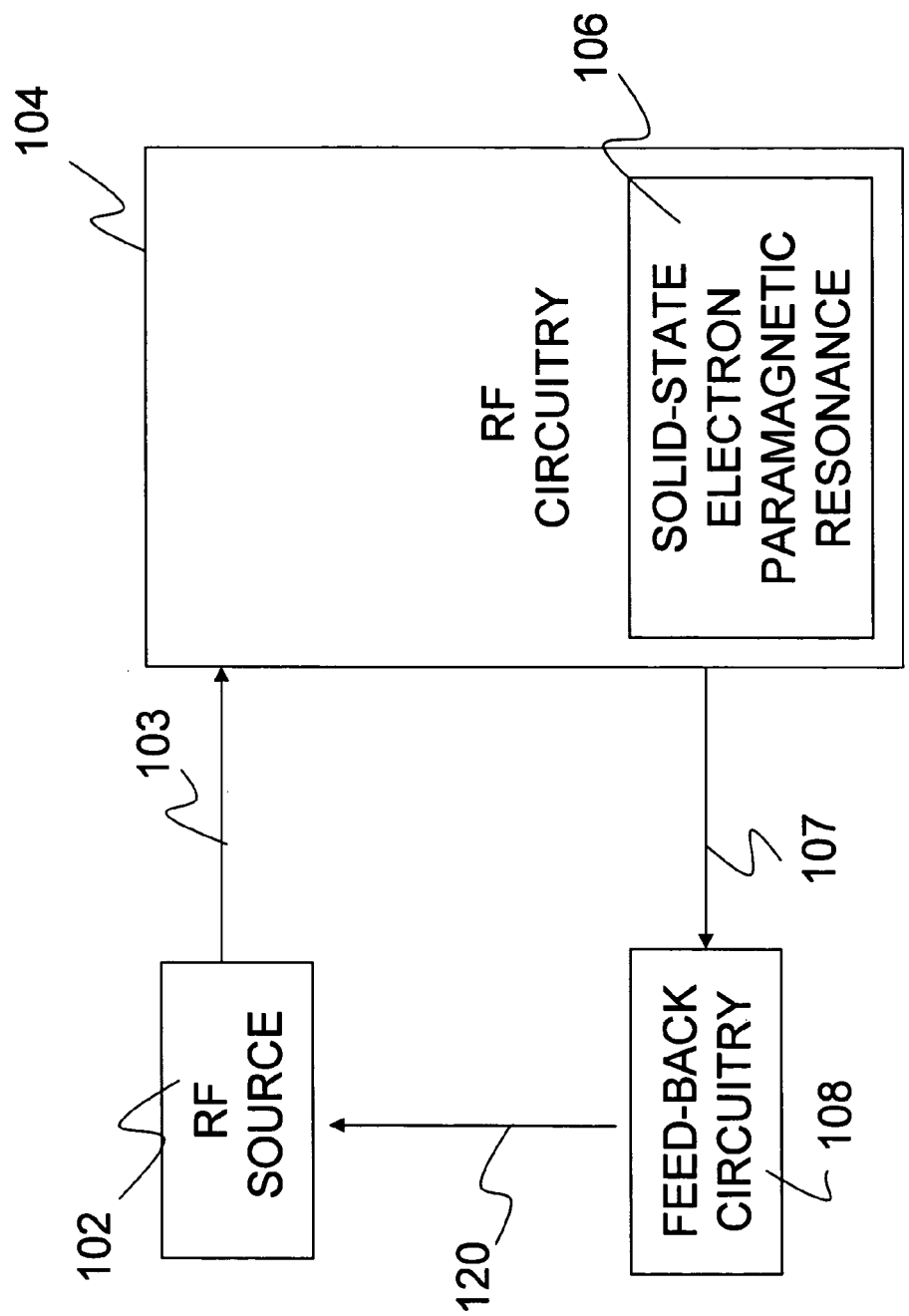
FIG. 1 depicts a frequency standard in accordance with the present invention.

The present invention relates to method and apparatus that provides a frequency standard that derives the reference frequency from the hyperfine spectrum of paramagnetic ions in solids. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles, defined herein, may be applied to a wide range of embodiments. Thus, the present invention is not intended to be limited to the embodiments presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

(1) Introduction

The system and method disclosed has many advantages over the prior art. Crystal oscillators are currently the only frequency standard offering acceptable cost, size and power consumption in a broad range of commercial and military applications. Although recent work miniaturizing rubidium frequency standards has a promising potential for very high precision applications, rubidium standards are too expensive for most commercial frequency reference applications.

The disclosed system and method is especially suited to high volume production because the manufacturing tolerances on the dimensions of the resonator do not need precise control or trimming. This is in contrast to frequency standards based on crystal oscillators where the quartz resonator must be precisely cut or etched to set the resonant frequency. In addition, the disclosed system and method has a substantial reduction in packaging cost because it eliminates the need for vacuum packages.

For high-performance applications, the disclosed system and method has much better yield than crystals. For example, the acceleration sensitivity of high-performance crystals depends on the symmetry of the stress on the crystal, from the electrodes and manufacturing process. Within a batch, only a few oscillators will have high performance. Adding additional shielding, sensors, or circuits to the disclosed system to enhance the performance has little impact on the manufacturing yield.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The description outlined below sets forth a method and an apparatus that provides a frequency standard that derives the reference frequency from the hyperfine spectrum of paramagnetic ions in solids.

(2) Frequency Standard Details

The following section includes a description of a non-limiting embodiment of a frequency standard designed in accordance with the present invention.

FIG. 1 depicts a frequency standard 100 in which the frequency of a radio frequency (RF) signal output 103 from a RF source 102 is received, and then compared, via RF circuitry 104, to a solid-state electron paramagnetic resonance 106. The RF circuitry 104 generates a compared output signal 107. Based on the compared output signal 107, the feedback circuitry 108 generates an error signal 120. The error signal 120 is used to adjust the frequency of the RF source 102 to the frequency of the solid-state electron paramagnetic resonance 106, i.e. implements a frequency-locked loop, where the adjusted RF signal is outputted. In one embodiment, the frequency of the solid-state electron paramagnetic resonance 106 is a zero-field electron paramagnetic resonance formed via magnetic dipole transitions between spin states of paramagnetic species, i.e. metal ions, in a solid dielectric. Further, in one embodiment, the magnetic dipole transitions are hyperfine transitions, to be discussed in more detail in the paramagnetic species section below. Thus, in this embodiment, the comparison of the RF signal is to the zero-field electron paramagnetic resonance generated by magnetic dipole transitions between spin states of metal ions in the solid dielectric.

One skilled in the art will appreciate that the feedback system shown in FIG. 1 has the effect of stabilizing, i.e. locking, the frequency variations of the RF source 102 to the signal from the solid-state electron paramagnetic resonance 106 for frequency variations within the loop bandwidth.

The short-term frequency stability, i.e., time scales where the noise floor of the measurement system is dominated by white noise, can be calculated from the quality factor (Q) of the paramagnetic resonance transition and the signal-to-noise (SNR) of the measurement. One skilled in the art will appreciate that the flicker noise (1/f) characteristics of the measurement system, or higher-order noise processes inherent to the paramagnetic resonance measurement, determine the frequency stability at longer time-scales.

Figure 2:
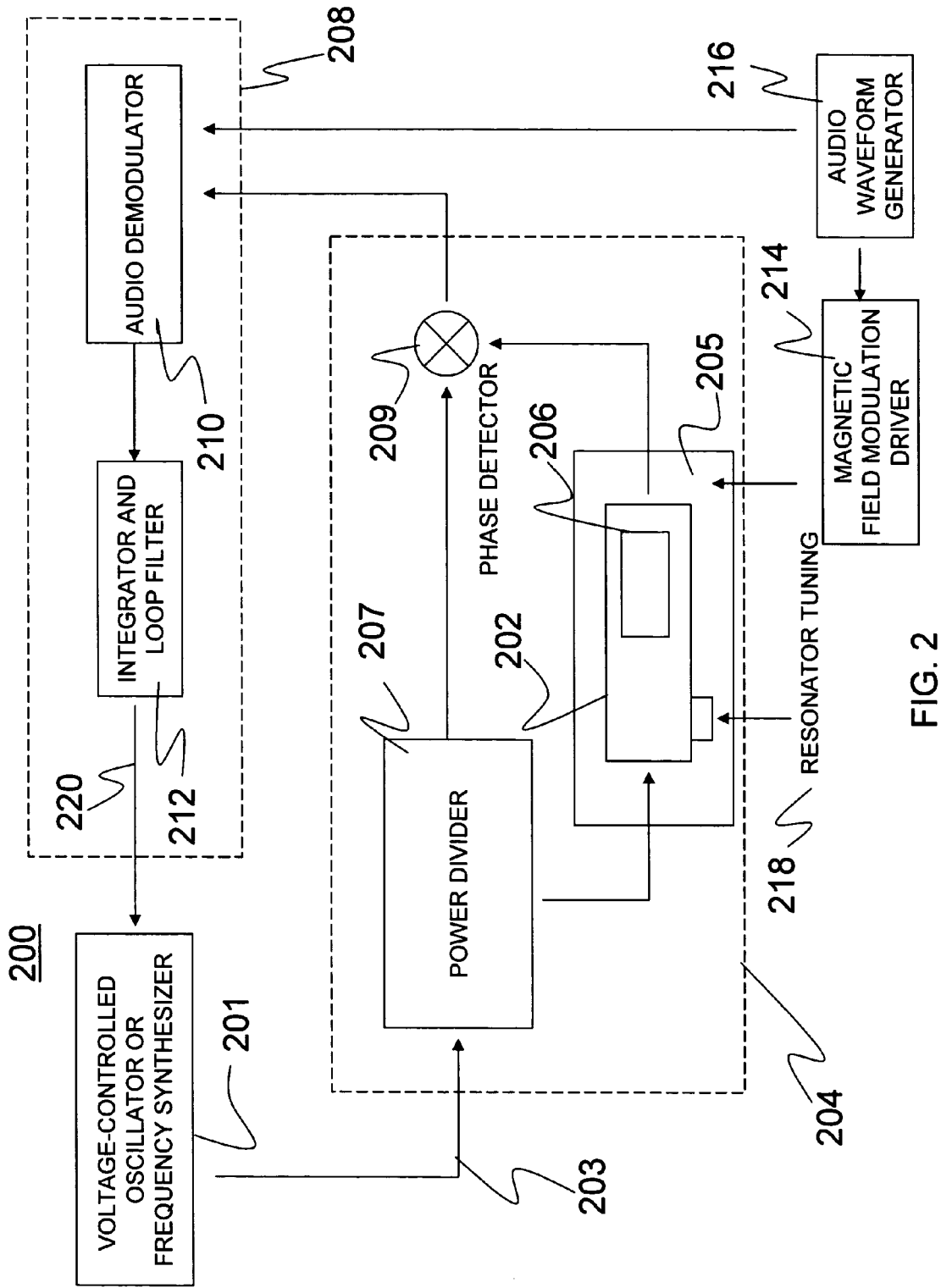
FIG. 2 depicts one embodiment of the frequency standard in accordance with the present invention.

FIG. 2 shows in greater detail one embodiment 200 of the frequency standard 100 of FIG. 1. The components and operation of the generic portions of the frequency standard 200 are well known in the art and, therefore, only briefly described herein. A frequency standard 200 includes an electrical resonator 202 which contains a solid-state electron paramagnetic resonance 106, see FIG. 1, which may be implemented by a paramagnetic dielectric 206. The magnetic susceptibility of the paramagnetic dielectric 206 varies with frequency according to the absorption and spersion introduced by the electron paramagnetic resonance 106, shown in FIG. 1. Thus, the interaction between the magnetic energy stored in the electrical resonator 202 and the magnetic properties of the paramagnetic dielectric 206 changes the quality factor and resonant frequency of the electrical resonator 202.

The frequency standard 200 comprises a RF source 201, i.e. a voltage controlled oscillator (VCO) or frequency synthesizer coupled with a power divider 207. A RF signal 203 is received by the power divider 207 from the RF source 201. The power divider 207 has two outputs, with a first output connected with a phase detector 209 (e.g. a mixer) and a second output connected with the electrical resonator 202. The phase of the two RF carrier signals received at the phase detector 209 is adjusted to null the output from the phase detector (i.e., in quadrature).

Essentially, a signal from the RF source 201 is passed through the power divider 207. One part of the signal is then passed to the electrical resonator 202. The signal that is passed through the electrical resonator 202 is phase-modulated according to an electron spin resonance of the paramagnetic dielectric 206 within the electrical resonator 202. The electrical resonator 202 will be described further below. The RF circuitry 104, as shown in FIG. 1, is indicated by the dotted box 204 in FIG. 2 and implemented by the power divider 207, the electrical resonator 202 and the phase detector 209. The RF circuitry 204 acts as a frequency discriminator which is sensitive to phase changes introduced by perturbations to the resonant frequency of the electrical resonator 202, but substantially insensitive to amplitude noise of the RF source 101.

As shown in FIG. 2, modulation coils 205 apply a magnetic field to the paramagnetic dielectric 206. The magnetic field modulation driver 214 controls the current through the modulation coils 205, and therefore the magnetic field. The magnetic field modulates the frequencies of the electron paramagnetic resonance transitions in the paramagnetic dielectric 206, and therefore the quality factor and frequency of the electrical resonator 202. The feedback circuitry 208 demodulates the phase modulation introduced by the modulation of the resonant frequency of the electrical resonator 202.

Figure 3:
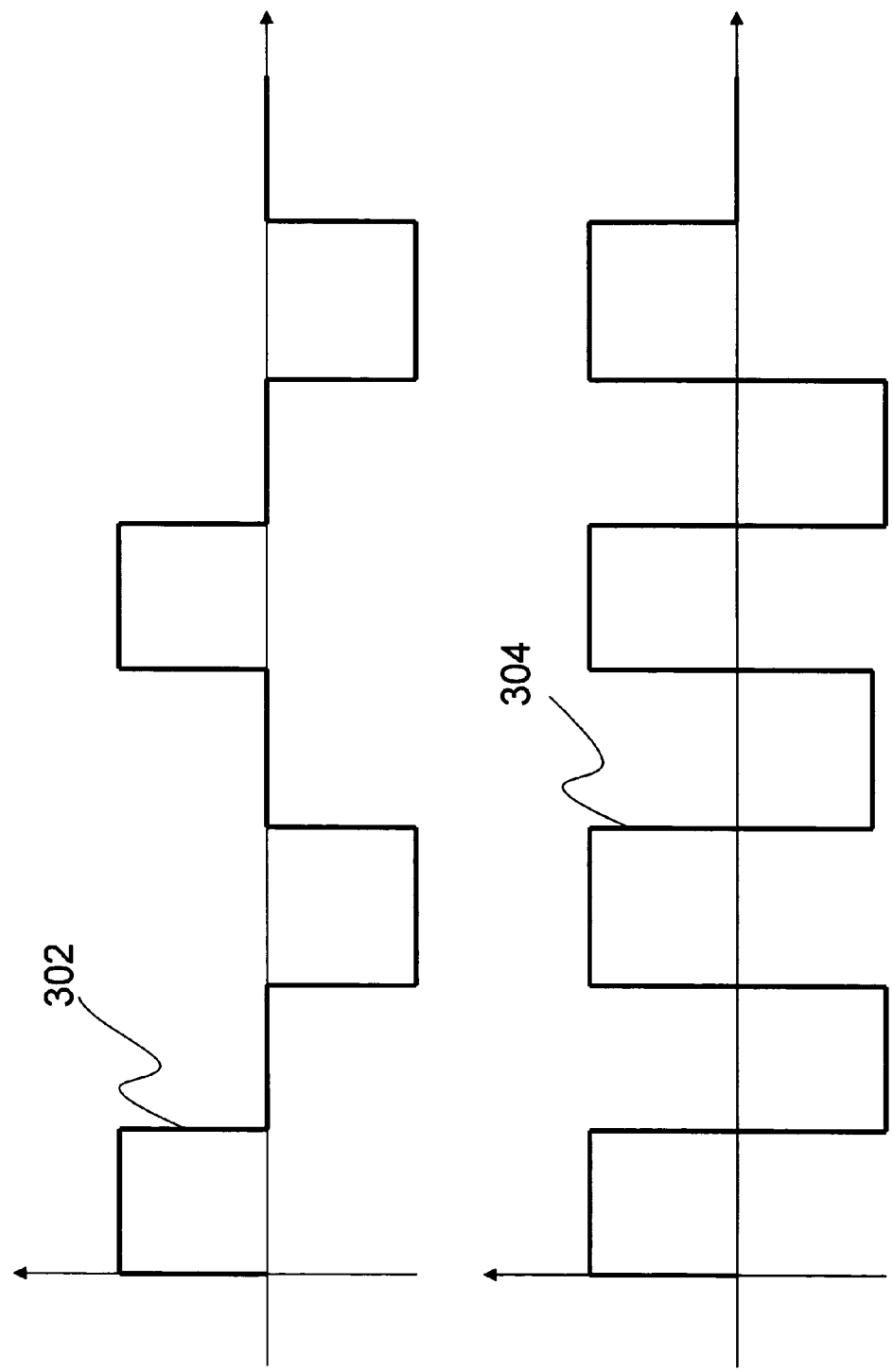
FIG. 3 depicts modulation waveforms in accordance with the present invention.

In one embodiment, the magnetic field modulation uses a bidirectional square-wave 302 illustrated in FIG. 3. This signal is generated by the audio waveform generator 216, shown in FIG. 2. The peak magnetic field amplitude is in the range of 20 to 30 Gauss. The fundamental frequency of the audio waveform 302 in FIG. 3 is in the range of 500 hertz (Hz) to 2 kilohertz (kHz); however, the optimal frequency will generally depend on the phase-noise characteristics of the RF source 201 and constraints on the precision of the audio waveform generator 216, the magnetic field modulation driver 214, the audio demodulator 210, and the remaining feedback circuits 208.

In one embodiment, the audio demodulator 210, shown in FIG. 2, multiplies the output from the phase detector 209 with a square-wave at the second-harmonic of the fundamental of the bi-directional modulation, shown as 304 in FIG. 3. At zero-magnetic field, the shift in the frequency of the electron spin resonance absorption of the paramagnetic dielectric 206 does not depend on the direction of the magnetic field; therefore, the desired electron spin resonance signal at the output from the phase detector 209 is similar to 304, and generates a DC output from the audio demodulator 210. On the other hand, spurious pickup of the bidirectional modulation 302 has no DC component when multiplied by the waveform 304. The magnetic modulation field may couple through various means to produce a spurious background signal; therefore, minimizing the sensitivity to modulation pickup is desirable in practice. For further discussion, refer to the article by Richard Bramley and Steven J. Strach: "Electron Paramagnetic Resonance Spectroscopy at Zero Magnetic Field," (1983) Chem. Rev., 83, 49–82, incorporated herein by reference.

The output of the audio demodulation 210 is coupled with an integrator and loop filter 212. The signal from audio demodulator 210 passes through the integrator and loop filter 212 and onto the tuning port of the RF source 201. This error signal 220 is used to adjust the RF source 102 to the proper frequency.

FIG. 4 shows one embodiment of a resonator tuning loop 218, shown in FIG. 2, which adjusts the frequency of the electrical resonator 202 to the frequency of the RF source 201. The RF circuits 204 are known as a transmission mode frequency discriminator. The resonator tuning feedback circuits consist of a buffer amplifier 402, integrator 404, and biasing circuits 406 which are used to adjust the voltage at the tuning port 410 of the electrical resonator 202. In one embodiment, the adjustment is made by varying the voltage presented to a variable capacitor 820, shown in FIG. 8b. The resonator tuning is explained in more detail below. The resonator tuning feedback connection is arranged to zero the DC output from the phase detector 209. When the DC output from the phase detector is zero, the RF inputs to the phase detector 209 are 90° out of phase.

The bandwidth of the resonator tuning loop 218 is much less than the fundamental frequency of the magnetic field modulation 302, shown in FIG. 3. For example, the bandwidth may be approximately 50–100 Hz, whereas the fundamental of the modulation frequency is 500 Hz. In this arrangement, phase perturbations introduced by the electron spin resonance signal are not compensated by the resonator tuning loop 218. A further aspect of the embodiment shown in FIG. 4 is that the delay between the first output port of the power divider 207 and the first input to the phase detector 209, called the reference arm, and the delay from second output port of the power divider 207 and the second input port of the phase detector 209 via the electrical resonator 202, called the main arm, are chosen such that the electrical resonator 202 is tuned to the frequency of the RF source 201 when the phase detector 209 inputs are in quadrature. For further information the reader is directed to U.S. Pat. No. 5,019,792, to Dibiase et al., entitled "Signal Tracking Electronically Tunable Filter," issued May 28, 1991 as one example of a frequency tuning loop.

The RF source 102, shown in FIG. 1, or 201, shown in FIG. 2, may be implemented in various ways depending on the phase noise requirements of the system. For example, integrated inductor-capacitor (LC) oscillators are generally the most economical, but for lower phase noise, oscillators using ceramic, surface-acoustic wave (SAW), or bulk-acoustic wave resonators may be preferred. Further, the frequency-locking loop may control a voltage-controlled crystal oscillator (VCXO) driving the reference pin of a frequency synthesizer, which generates the RF frequency, or be implemented using a microprocessor to digitally control the divider ratio of a frequency synthesizer, rather than directly controlling the RF VCO.

In one embodiment, the power divider 207 is implemented following the RF source 201, as shown in FIG. 2. The power divider 207 may be implemented using a resistive power divider. The phase detector 209 may be a double-balanced mixer, for example a passive diode-ring mixer or a Gilbert cell mixer. In one embodiment, the RF power from the RF source 201 is approximately 10 decibels per milliwatt (dBm), while the power at the input port of the phase detector 209 is close to 0 dBm, because of the insertion loss of the power divider 207 and electrical resonator 202. In general, the optimal RF power depends on the noise properties of the RF source 201, the noise properties of the phase detector 209 and the design of the electrical resonator 202.

In one implementation, the RF source 201, phase detector 209, RF circuitry 204, feedback circuitry 208, modulation driver 214 and integrator loop and filters 212 are integrated on a single silicon die; however, these circuits may also be implemented using printed circuits boards and discrete components, using monolithic microwave integrated circuits (MMICs), or a combination of technologies.

(a) Loop-gap Resonator

As previously discussed, FIG. 2 depicts an electrical resonator 202. One example of an electronic resonator that may be used is a loop-gap resonator, which is depicted in FIGS. 5a–5e.

FIG. 5a is an illustration of a loop-gap resonator 502. The loop-gap resonator 502 comprises a first RF connector 504, shown in FIG. 5a and a second RF connector 505, shown in FIG. 5b, and a resonator shield 506. The resonator shield 506 is surrounded by multiple turns (only two are shown in FIG. 5a for simplicity) of a coil assembly 508, such as a Helmholtz coil assembly. The coil assembly 508 induces a magnetic field inside a metal, or metal plated, ring 522.

FIG. 5*b* depicts a cross-section of the loop-gap resonator 502. The "loop-gap" or "split-ring" resonator consists of a metal or metal plated ring 522, which forms an inductive loop, and one or more capacitive gaps 521-1, 521-2, as shown in FIG. 5*c*. Thus, the loop-gap resonator 502 is a type of lumped LC resonator. In one embodiment, the inner diameter of the ring 522 is 12 millimeters, and outer diameter is 20 millimeters, and the height is 11.5 millimeters.

The frequency of the loop-gap resonator 502 can be mechanically tuned over more than one octave by varying the thickness of the one or two of the conductive gaps 521-1, 521-2, shown in FIG. 5*c*, and therefore the capacitance of the LC resonator. In one embodiment, the conductive gaps 521-1, 521-2 are 75 microns wide.

In FIG. 5*b*, the resonator shield 506 can be seen along with leads to the coil winngs 508. The coils 508 are used to apply a uniform modulating magnetic field at the ring 522 inside the loop-gap resonator 502. In one embodiment, the inner diameter of the resonator shield 506 is 30 millimeters and the inner height is 25.4 millimeters. In one embodiment, the coils 508 are Helmholtz coils wound from 20 turns of 24 AWG magnet wire. The diameter of the coils is approximately 45 millimeters, and the spacing of the two coils is 23 millimeters. As is known in the art, the magnetic field inside Helmholtz coil pair is uniform over approximately ⅔ of the radius.

FIG. 5*b* also depicts that the loop-gap resonator 502 further comprises a coupling loops 520-1 and 520-2. The first coupling loop 520-1 is for coupling the signal from the power divider 207, shown in FIG. 2, and the second coupling loop 520-2 is for coupling the signal out of the loop-gap resonator 502 to the phase detector 209, also shown in FIG. 2, via the mutual inductance between the coupling loop 520 and the ring 522.

In one embodiment, the coupling loops 520-1 and 520-2 are made from silver plated 18-gauge phosphor bronze wire. The inner diameter of the coupling loops 520-1 and 520-2 is approximately 4 millimeters. The center of the loop-gap resonator 502 includes a paramagnetic species or dopant contained in a solid dielectric 524, shown in FIGS. 5*b*, 5*c* and 5*e*, which interacts with the magnetic field inside the ring 522. As is known in the art, the RF magnetic field is substantially uniform inside the loop 522, and therefore, the paramagnetic resonance saturates uniformly at high carrier power. In a further aspect of the design, resonator and coupling loop holders are machined from Rexolite® (C-Lee Plastics, Inc., Philadelphia, Pa.) (not shown in FIG. 5). The design of loop-gap resonators is extensively elaborated in the scientific literature on electron spin resonance, see references below.

Examples of prior art loop-gap resonators are described in the following articles, incorporated herein by reference: W. Piasecki, W. Froncisz, and James S. Hyde, "Bimodal loop-gap resonator," (1996) Rev. Sci. Instrum., 67, 1896; S. Pfenninger, W. Froncisz, J. Forrer, J. Luglia, and James S. Hyde, "General Method for Adjusting the Quality Factor of EPR resonators," (1995) Rev. Sci. Instrum., 66, 4857; T. Christides, W. Froncisz, T. Oles, James S. Hyde, "Probehead with Interchangeable Loop-gap Resonators and RF Coils for Multifrequency EPR/ENDOR," (1994) Rev. Sci. Instrum., 65, 63 (1994); W. Froncisz and James S. Hyde, "The Loop-gap Resonator: A New Microwave Lumped Circuit ESR Sample Structure," (1982), J. Magnetic Resonance, 47, 515; W. N. Hardy and L. A. Whitehead, "Split-ring resonator for use in magnetic resonance from 200–2000 MHz," (1981) Rev. Sci. Instrum., 52, 213.

Minimizing leakage of the RF signal stored in the electrical resonator 202 is necessary to prevent unwanted mixing between the RF and modulation signals. As is known in the art, one effective technique is to electroplate the resonator shield 506, shown in FIG. 5*a*, of the loop-gap resonator 502 to a thickness of approximately 10 microns. The audio-frequency magnetic field penetrates this thin layer of metal with very little attenuation, and the RF signal is completely shielded, because the skin-depth is typically much less than 10 microns. In one embodiment, the loop-gap resonator 502 may be machined from a machinable glass ceramic such as MACOR® (Corning Inc., Corning, N.Y.). Chemical deposition of silver, also known as silvering, on the MACOR® may be used to deposit a conductive seed layer, followed by electroplating to deposit approximately 10 microns of silver on the resonator shield 506.

As previously mentioned, the loop-gap resonator 502 also has the advantage of tunabilty by mechanically varying the thickness of one or both of the capacitive gaps 521-1 and 521-2. Further, varactor tuning is possible over a narrow frequency band. A control loop may be used to align the resonator center frequency to the frequency of the RF source 202, shown in FIG. 2. An example of such a control loop is previously discussed and shown in FIG. 4. Further, other techniques for implementing a multi-octave tunable loop-gap resonator are disclosed in: Delfs and Bramley, Journal of Chemical Physics 107, 8840, Delfs and Bramley, Chemical Physics Letters, 264, 333 and Bramley and Strach, Journal of Magnetic Resonance, 61, 245, herein incorporated by reference.

(b) Paramagnetic Species

In choosing the appropriate solid-state electron paramagnetic resonance 106, shown in FIG. 1, i.e. the solid dielectric 524 shown in FIG. 5*e*, several properties of the solid-state electron paramagnetic resonance 106 should be considered, such as: (1) a strong hyperfine interaction; (2) long thermal relaxation time of the magnetic dipole (hyperfine) transitions at room temperature; (3) a fine structure, i.e. the crystal field interaction should be zero; (4) a small variation in the hyperfine interaction with temperature, which depends both on the dopant and the lattice; and (5) favorable electrical and manufacturing properties.

One skilled in the art will appreciate that groups of possible materials, which satisfy the desired characteristics outlined above, can be identified from general chemical characteristics. For example, common dopants in silicon, such as phosphorus and arsenic, have electron spin resonance spectra at liquid nitrogen temperatures. However, operation at low temperatures is extremely undesirable from the point of view of practical application.

For background information regarding electron-spin resonance, the reader is directed to Charles P. Poole, Jr. and Horacia A. Farach, Handbook of Electron Spin Resonance, Volume 1 and 2, Springer-Verlag New York, Inc. 1999, and J. R. Pilbrow, Transition Ion Electron Paramagnetic Resonance, Clarendon Press Oxford (1990), c.f. Chapter 12 on Zero-field EPR.

The following Hamiltonian equation:

$$H = I \cdot A \cdot S + \mu_s \cdot B + \mu_n \cdot B$$

describes the quantum mechanics of a paramagnetic ion with a hyperfine interaction (represented by the tensor A) between the nuclear spin (represented by the spin operator I)

and the electron spin (represented by the operator S), and Zeeman terms giving the interaction between the nuclear and electron magnetic moments ($\mu_s$ and $\mu_n$, respectively) and an external magnetic field B. The nuclear Zeeman term is usually neglected in electron paramagnetic resonance.

The isotropic component of the hyperfine interaction A is proportional to the probability of the electron(s) being at the nucleus. The anisotropic component of the hyperfine interaction arises from the polar interaction between the nuclear magnetic moment and the electron magnetic moment.

If the hyperfine term in the Hamiltonian is zero, the frequency of the electron paramagnetic resonance (i.e. the single magnetic dipole allowed transition) is proportional to the applied magnetic field B, and therefore a system similar to the disclosure may be used as a magnetic field to frequency converter.

In contrast, when the magnetic field B is zero and the hyperfine term is non-zero, the magnetic dipole allowed transitions depend only on the hyperfine term, which arises from the internal interaction between the nuclear spin and electronic spin, as mentioned above. The zero-field hyperfine transitions are an intrinsic property of the material, and therefore useful as a frequency standard.

Taking into account the properties of different materials, in one implementation, the solid-state electron paramagnetic resonance 106, shown in FIG. 1, may be derived from a paramagnetic species that may comprise of a dopant, such as vanadium (V), and a dielectric, such as magnesium oxide (MgO). In particular, the divalent vanadium ion ($V^{2+}$) incorporates substitutionally into the octahedral magnesium oxide lattice, and is a paramagnetic species that may be used as the frequency reference. The spectrum of $V^{2+}$ in MgO is reported in the following article, incorporated herein by reference: "Paramagnetic Resonance Spectra of Some Ions of the 3d and 4f Shells in Cubic Crystalline Fields," W. Low, Physical Review, vol. 101, no. 6, Mar. 15, 1956, pp. 1827–1828.

Figure 6:
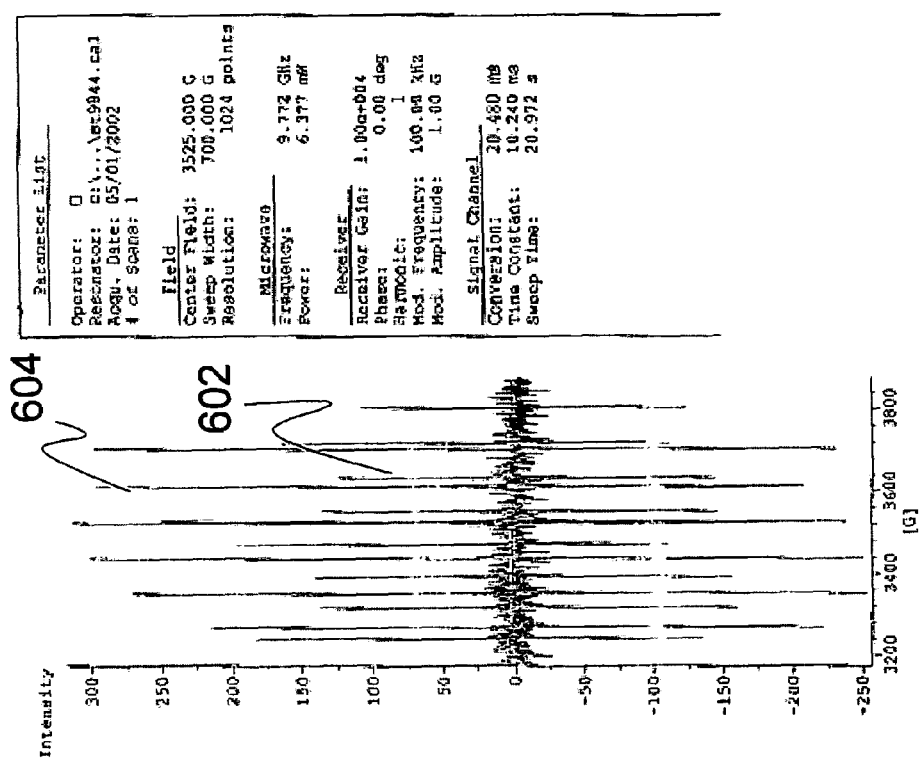
FIG. 6 depicts the high-field spectrum of a vanadium doped magnesium oxide crystal in accordance with the present invention.

FIG. 6 depicts the high-field spectrum of a vanadium doped magnesium oxide (MgO) crystal used in one embodiment of the invention, measured using a Bruker X-band electron spin resonance (ESR) spectrometer (Billecia, Mass.). The center field was set to 3525 gauss (G), while the sweep width was set to 700 G, and the resolution was set to 1024 points. The frequency was set to 9.772 gigahertz and the power was set to 6.377 milliwatts. The receiver gain was set to 10,000 with a zero degree phase shift, a modulation frequency of 100 kilohertz and a modulation amplitude of 1 G. The conversion was 20.48 milliseconds, the time constant was 10.24 milliseconds and the sweep time was 20.972 seconds.

The plot shown in FIG. 6 is of the MgO crystal as the swept magnetic field in Gauss versus intensity. The set of eight smaller lines 602 is due to the vanadium in the spectrum. The spectrum shown is for a single crystal sample of MgO obtained from Escete Single Crystal Technology, The Netherlands, nominally doped 450 parts per million (ppm) vanadium , however, the spectrum is for the faction of vanadium which incorporates into the lattice as a divalent ion, some of the vanadium ends up in the trivalent state, which is not visible in the measurement. Manganese is also present in the sample and adds the additional set of six larger lines 604 seen in the spectrum.

The Hamiltonian of $V^{2+}$ in MgO in a zero magnetic field is:

$$H = A(I \cdot S)$$

where I is the spin of the nucleus and is 7/2, S is the spin of the electrons and is 3/2, and the hyperfine coupling constant A is approximately 225 megahertz (MHz), using frequency units instead of energy.

The zero-field spectrum of $V^{2+}$ in MgO is calculated from the Hamiltonian determined from X-band field-swept measurements. FIG. 7 depicts zero-field transitions of vanadium doped magnesium oxide. From the zero-field Hamiltonian one can calculate that, at zero-field, there are three magnetic dipole allowed transitions. Further, one can calculate that the frequency of these transitions is 3A, 4A, and 5A where the hyperfine constant A is 225 MHz. Therefore, the zero-field spectrum consists of three resonance lines, absorption lines at approximately 3*225=675 MHz, 4*225=900 MHz, and 5*225=1125 MHz. FIG. 7 shows the four zero-field energy levels calculated from the zero-field Hamiltonian, and the three allowed transitions between those energy levels.

One skilled in the art will appreciate that paramagnetic solids, other than vanadium doped MgO, may be used in the electrical resonator 202 shown in FIG. 2, and thus as the solid-sate electron paramagnetic resonance 106 as shown in FIG. 1. Trivalent chromium ($Cr^{3+}$) is isoelectronic with $V^{2+}$, both have $3d^3$ ions, and the zero-field spectrum of $Cr^{3+}$ in magnesium oxide has been measured as reported in the following paper, incorporated herein by reference: "Zero-Field Electron Magnetic Resonance of Some Inorganic and Organic Racals," Terry Cole, Toshimoto Kushida, and Hanan C. Heller, The Journal of Chemical Physics, vol. 38, no. 12, 15 Jul. 1963, pp.2915–2924.

The only difference between $Cr^{3+}$ and $V^{2+}$ in MgO is the spin of the nucleus, which is 3/2 (9.55% natural abundance) for chromium and 7/2 (99.76% abundance) for vanadium. The zero-field spectrum of $Cr^{3+}$ in MgO, measured in the above-referenced paper by Cole, Kushida, and Heller, is consistent with the Hamiltonian for the chromium ion determined from high-field measurements.

There are many examples of zero-field electron spin resonance spectra, some of which are summarized in the following articles, incorporated herein by reference: Christopher D. Delfs and Richard Bramley, "Zero-field electron Magnetic Resonance Spectra of Copper Carboxylates," (1997) J. Chem. Phys. 107, 8840; Christopher D. Delfs and Richard Bramley, "The Zero-Field ESR Spectrum of a Copper Dimer," (1997), Chemical Physics Letters, 264, 333; Richard Bramley and Steven J. Strach, "Zero-field EPR of the Vanadyl Ion in Ammonium Sulfate," (1985) J. of Magnetic Resonance, 61, 245; and Richard Bramely and Steven J. Strach, "Electron Paramagnetic Resonance Spectroscopy at Zero Magnetic Field," (1983) Chem. Rev., 83, 49–82.

One skilled in the art will appreciate that several dielectrics with the same crystal structure as magnesium oxide can be used as the lattice for divalent vanadium , e.g. calcium oxide and zinc oxide. One consideration in choosing a dielectric is the temperature-dependence of the reference line. In general, more covalent crystals (such as zinc oxide) have stronger temperature-dependence, which can, in fact, be useful in certain applications as a temperature sensor. The temperature-dependence of vanadium ions in various crystals is reported in the following article, incorporated herein by reference: "Temperature-Dependent Crystal Field and Hyperfine Interactions," Walter M. Walsh, Jr. and Jean Jeener and N. Bloembergen, Physical Review, vol. 139, no. 4a, 16 Aug. 1965, pp. A 1338-A 1350.

Many other crystals may not be desirable if they are composed of atoms with non-zero nuclear spin. Magnetic nuclei in the lattice broaden the spectrum, and in some cases, complicate the spectrum because of the super-hyperfine interaction. As a result, magnesium oxide may be chosen as it does not exhibit these negative features and is readily available in ceramic and single crystal form.

The following reference describes the spectrum of manganese-doped calcium oxide, and the preparation of calcium oxide (CaO) in ceramic form, and is incorporated herein by reference: "Influence of manganese concentration on the ESR spectrum of $Mn^{2+}$ in CaO," R. S. de Biasi, M. L. N. Grillo, Journal of Alloys and Compounds 282 (1999) pp. 5–7. Magnesium oxide can be prepared in ceramic form using a similar process. One skilled in the art will appreciate that in a zero-field, the orientation of the crystal structure does not matter, unlike high-field where in general the transmission absorption frequency depends on the alignment of the swept magnetic field relative to the crystal axes. Thus, the paramagnetic dielectric can comprise of a single crystal or an amphorous crystal.

The choice of vanadium -doped magnesium oxide describes one embodiment of the present invention. However, one skilled in the art will appreciate that other combinations of materials and dopants fall within the scope of the disclosure.

(3) Other Resonators

Figure 8B:
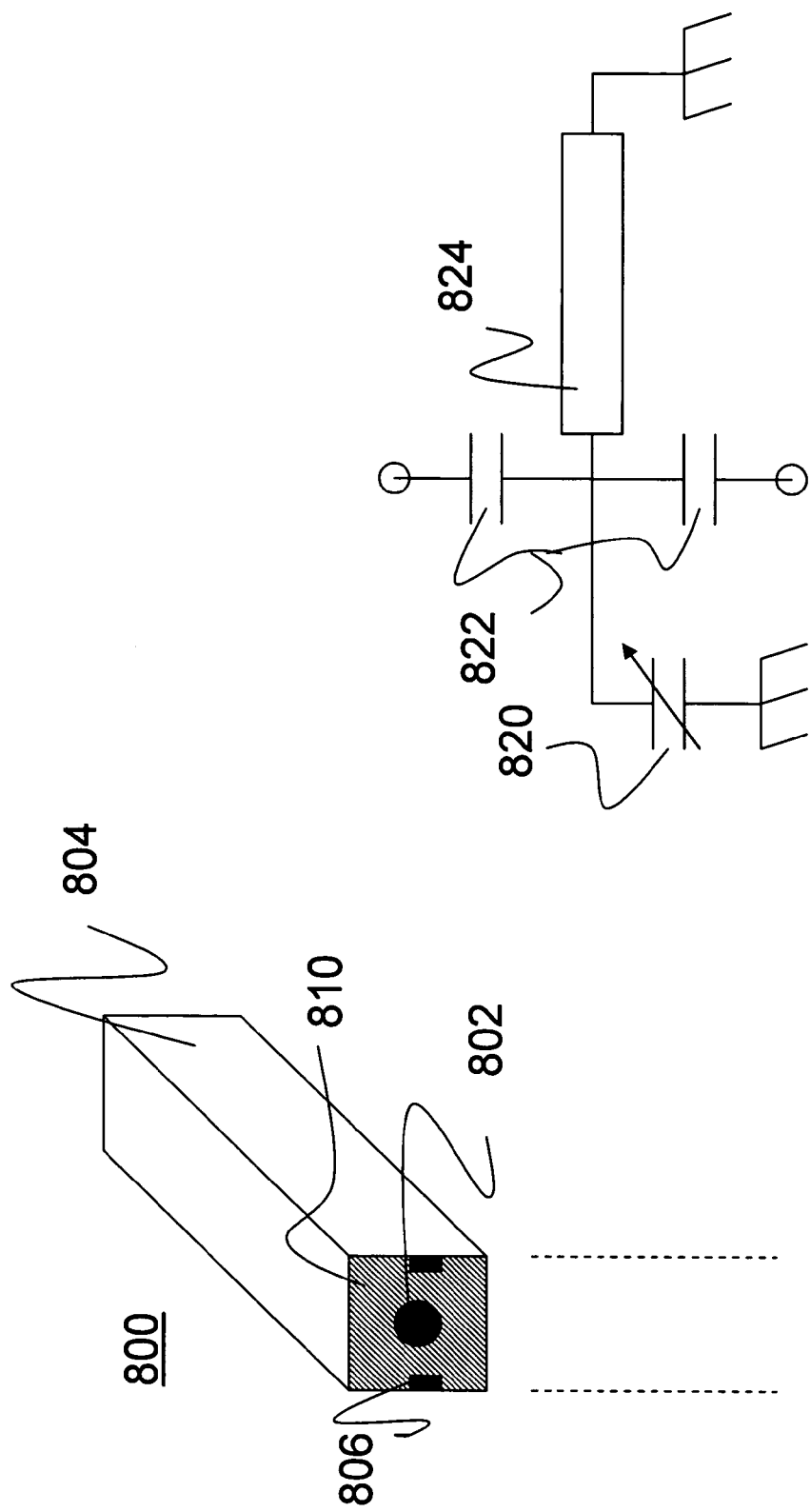
FIG. 8b depicts an electrical model including the coaxial resonator in accordance with the present invention.

As previously described, in one non-limiting embodiment the electrical resonator 202, shown in FIG. 2 may be a loop-gap resonator 502 as shown in FIGS. 5a–5e; however, other resonator designs, such as coaxial resonators, shown in FIGS. 8a and 8b, and toriodal resonators, shown in FIGS. 9a–9e, may also be used.

(a) Coaxial Resonators

FIG. 8a depicts a coaxial resonator 800, having an outer conductor 804, a center conductor 802, coupling electrodes 806, and a paramagnetic dielectric 810, such as vanadium -doped MgO.

FIG. 8b depicts an electric model including the coaxial resonator 800. The length of the transmission line 824 is approximately one quarter wavelength. The coupling electrodes 806 have a capacitance 822 to the open circuit end of the coaxial resonator 800. In addition, a tunable capacitor 820, i.e. a varactor, may be used to fine-tune the coaxial resonator frequency. The tunable capacitor 820 corresponds to the tuning port 218 of the electrical resonator 202 shown in FIG. 2. As is known in the art, the coupling capacitors 822 determine the loaded-Q of the circuit shown in FIG. 8b, while the unloaded-Q of the coaxial resonator is determined by resistive loss in the metal conductors and the volume of the coaxial resonator 800. The insertion loss of the coaxial resonator is related to the ratio of the loaded and unloaded Q.

One skilled in the art will appreciate that the loop-gap resonator 502, shown in FIGS. 5a–5e, has a large quality factor (Q) and fill factor in the low microwave bands between one and four gigahertz, and the sensitivity of a spectrometer employing a loop-gap resonator is similar to the more common X-band spectrometers using cavity resonators to within a factor of 2 or 3. Small coaxial resonators, such as those shown in FIGS. 8a–8b, entirely filled with doped dielectric could have similar sensitivity.

(b) Toroidal Resonators

Figure 9B:
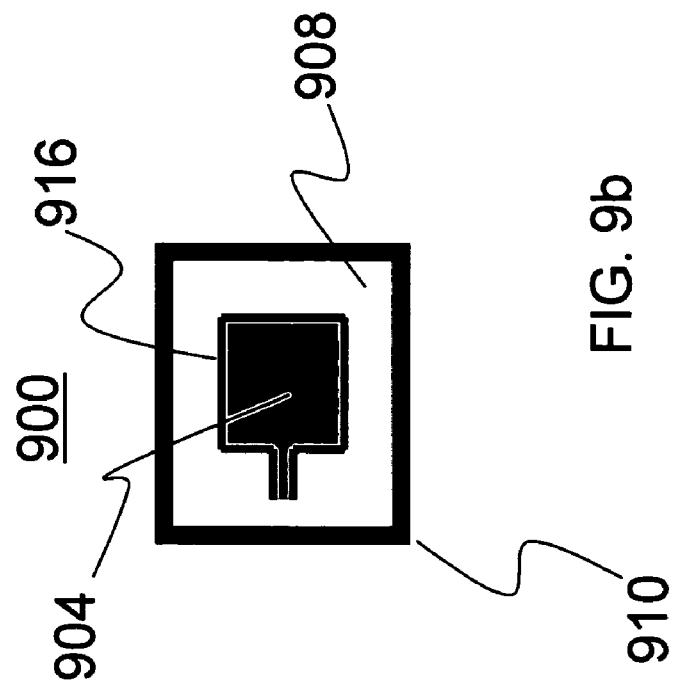
FIG. 9b depicts a cross-section of the toroidal resonator in accordance with the present invention.
Figure 9A:
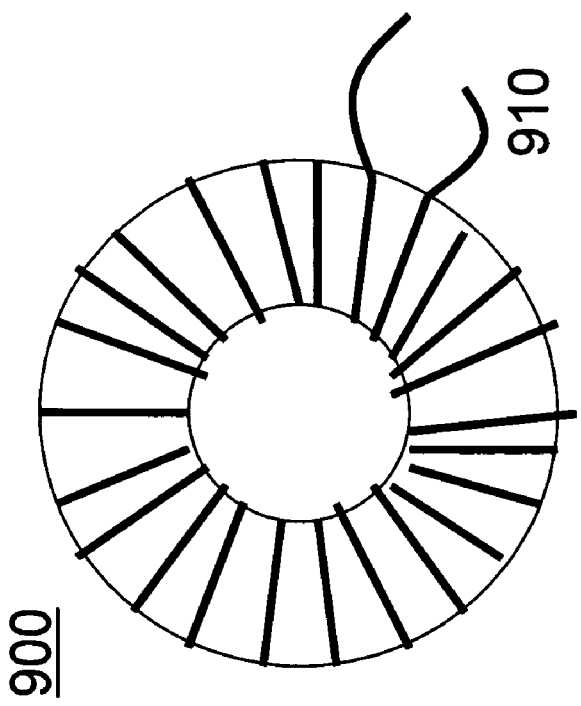
FIG. 9a depicts a top view of a toroidal resonator in accordance with the present invention.

In another non-limiting embodiment, the electrical resonator 202, shown in FIG. 2 and modulation coils 205 may be implemented using a toroidal resonator 900 as depicted in FIGS. 9a–9e. FIG. 9a depicts a top view of the toroidal resonator 900 showing the modulation coils 910. The modulation coil 910 is used to apply a homogeneous magnetic field to the paramagnetic dielectric 904, shown in FIG. 9b.

FIG. 9b depicts a cross-section of the toroidal resonator 900, including paramagnetic dielectric 904, outer conductor 916, thermal insulation 908, and modulation coils 910. In one embodiment, the solid, paramagnetic dielectric 904 is a paramagnetic species such as vanadium doped MgO. The outer conductor 916 and paramagnetic dielectric 904 form a resonant circuit shown in FIG. 9e. As shown in FIG. 9b, the paramagnetic dielectric 904, which is surrounded by thermal insulation 908 and magnetic field modulation coil 910 makes up a portion of the toroidal inductor 926. The field, B, inside the modulation coil 910 is related to the current through the modulation coil as follows:

$$B = \frac{\mu_0 n I}{2\pi r}$$

where I is the current through the coil in amperes, n is the total number of windings, r is the radius from the center of the toroid in meters, and $\mu_0$ is the permittivity of free space.

Temperature sensors and resistive heaters (not shown) may also be included to regulate the temperature of the paramagnetic dielectric 904. Magnetic shielding (not shown) may also be added to enclose the modulation coils 910. One skilled in the art will appreciate that in certain applications, the toroidal resonator 900 has the advantage of containing the modulating magnetic field within the toroid. This is an advantage because audio magnetic fields are very difficult to shield, and "open" geometries such as the Helmholtz coils, described in reference to FIG. 2, or a standard solenoid have substantially fringing fields which may result in spurious pickup of these signals.

FIG. 9c shows a different top view of one embodiment of the toroidal resonator 900, which does not include the modulation coils 910 or thermal insulation 908 shown in FIGS. 9a and 9b, but rather shows in greater detail the RF resonator made from the outer conduction 916 and paramagnetic dielectric 904. The inductive element of the RF resonator consists of a single turn toroidal inductor 926, and the capacitive element of the resonator is formed from top-electrode 922-1 and bottom electrode 922-2, which are the top and bottom electrodes of a parallel plate capacitor. The electrical model of the resonant LC circuit is depicted in FIG. 9e. The inductance (L) of the toroid is related to the cross-section area of the toroidal inductor 926, shown as the shaded region 950 in FIG. 9d, and mean radius of the toroid, shown by the distance 952 in FIG. 9c, by the approximate formula:

$$L = \frac{\mu_0}{2\pi r} A$$

In the inductance formula, A is the area of the cross-section 950 of the toroidal inductor 926, and r is the mean radius 952 of the toroidal inductor 926. Current circulates around the perimeter of the outer-conductor 916, shown in FIG. 9b. In one embodiment of the invention, the toroidal inductor 926 is filled with a paramagnetic dielectric 904, such as vanadium doped magnesium oxide. The RF magnetic field circulating inside the toroidal inductor 926 interacts with the paramagnetic ions in the paramagnetic dielectric 904.

A capacitive gap 928 is formed between top and bottom electrodes 922-1 and 922-2, shown in FIG. 9d. One skilled in the art will appreciate that the capacitive gap 928, shown in FIG. 9d, forms a capacitive ring under the top electrode 922-1, shown in FIG. 9c. The capacitance of this gap 928 is determined by the area of the ring and the spacing of the electrodes 922-1 and 922-1. In a variation, the capacitive ring may be replaced by a discrete capacitor 922-a connected at one point to the single turn toroidal inductor 926, as shown in the electrical model FIG. 9e. The values of L and capacitance (C) are chosen to resonate at a frequency close to the desired electron spin resonance frequency.

FIG. 9e depicts an electrical model of the toroidal system. The inductor 926-a is the electrical representation of the toroidal inductor 926. The capacitor 922-a is the electrical representation of a capacitor ring made by electrodes 922-1 and 922-2 or of a capacitor soldered to the toroidal inductor 926. The resonator is coupled using capacitors 924. The capacitors 924 may be discrete components connected to the resonator capacitor 922-a, or may be formed by patterning additional electrodes in the capacitive portion of the outer metal 916 (not shown in the figures). Fine tuning of the resonant frequency is performed via a varactor or other tunable capacitor 920 coupled to the resonator.

(4) Frequency Discriminators

The design depicted in FIG. 2 uses a transmission-based frequency discriminator design. However, there are other designs, such as a reflection-based design, shown in FIG. 10 and a lock-in marginal resonator design, shown in FIG. 11, that can be used to implement a system where the frequency of the RF source 102 is locked to the frequency of a solid-state electron paramagnetic resonance 106, shown in FIG. 1.

(a) Reflection-based Frequency Discriminator Design

Another design is based on the reflection-based design of electron spin resonance spectrometers, as described in U.S. Pat. No. 4,803,624 issued Feb. 7, 1989, to Pilbrow et al. One embodiment of a reflection design of a frequency reference is depicted in FIG. 10, where RF circuitry 204 in FIG. 2 is replaced by the RF circuitry shown in FIG. 10. The signal from the RF source is received at the power divider 1006 and then is coupled from the first output port 1004 of the power divider 1006 to the electrical resonator 1002 via a circulator 1003. The reflected signal from the electrical resonator 1002 is coupled through the circulator 1003 to the phase detector 1008. The electrical resonator 1002 in the reflection-based design is coupled at only one port, rather than two ports, as discussed in the transmission-based design, shown in FIG. 2.

The phase and amplitude of the reflection from the electrical resonator 1002 depends on the impedance matching between the electrical resonator 1002 and its coupled transmission line. The paramagnetic resonance of the paramagnetic dielectric 1001 contained in the electrical resonator 1002 modulates the frequency and quality factor the resonator, and therefore the resonator impedance. The modulation of the impedance results in phase and amplitude modulation of the RF signal reflected from the electrical resonator 1002 to the phase detector 1008. A reflection type of zero-field electron magnetic resonance spectrometer is described in previously cited Christopher D. Delfs and Richard Bramley, "Zero-field electron Magnetic Resonance Spectra of Copper Carboxylates," (1997) Journal of Chemical Physics 107, 8840.

In one embodiment, tuning of the resonator to the frequency of the RF source is accomplished in the reflection design by overcoupling the electrical resonator 1002, as described in U.S. Pat. No. 5,019,792 issued May 28, 1991 to DiBiase et al., entitled "Signal Tracking Electronically Tunable Filter," incorporated herein by reference. The delay along the reference arm is such that the DC output from the phase detector is zero when the resonator 1002 is tuned to the frequency of the RF source.

(b) Lock-In Marginal Oscillator Design

Yet another design that can be used is known as a lock-in marginal oscillator design and is depicted in FIG. 11. Marginal-oscillator magnetic resonance spectrometers are known in the art of magnetic-resonance spectroscopy; for example, previously cited "Zero-Field Electron Magnetic Resonance of Some Inorganic and Organic Racals," Terry Cole, Toshimoto Kushida, and Hanan C. Heller, The Journal of Chemical Physics, vol. 38, no. 12, 15 Jul. 1963, pp. 2915–2924, used a marginal-oscillator spectrometer to measure the zero-field electron spin resonance spectrum of several paramagnetic materials, including $Cr^{3+}$ ions in MgO. U.S. Pat. No. 3,548,298, issued Dec. 15, 1970 to M. S. Adler, discloses a transistorized nuclear magnetic resonance gaussmeter, which uses a lock-in nuclear magnetic resonance gaussmeter i.e. a marginal-oscillator nuclear magnetic resonance spectrometer and a servo to frequency lock the RF oscillator to the magnetic resonance frequency.

FIG. 11 shows one embodiment of a lock-in magnetic resonance spectrometer design, which contains a paramagnetic dielectric 1101 in the electrical resonator 1102. The electrical resonator 1102 is connected to the negative-resistance circuit 1107 to form an oscillator. The oscillation frequency may be tuned via the resonator tuning port 1118. In a marginal-oscillator circuit, the positive feedback from the oscillator circuits 1107 is just above the threshold of oscillation, such that the oscillation amplitude is approximately proportional to the quality factor of the of the electrical resonator 1102. The magnetic field modulation applied to the paramagnetic dielectric 1101 using modulation coils 1104, as discussed previously in relation to FIG. 2, modulates the quality factor (Q) of the electrical resonator 1102 when the oscillator frequency is close to the paramagnetic resonance absorption. The paramagnetic resonance absorption results in amplitude modulation of the oscillation envelope, and the amplitude modulation is demodulated using the envelope detector 1105. The feedback circuitry 1109 uses the demodulated oscillation envelope and audio waveform from the audio waveform generator 1116 to lock the oscillator frequency to the peak of the electron paramagnetic resonance absorption of the paramagnetic dielectric 1101.

(5) Temperature Regulation

Regardless which frequency standard design is chosen, temperature stabilization of the reference frequency is an important characteristic of a frequency standard. In one embodiment, the temperature of the electrical resonator is regulated using an integrated resistive heater and a temperature sensor. Direct temperature regulation is particularly easy in the present invention because the heater and thermometer can be directly coupled to the electrical resonator. Piezoelectrical resonators are packaged in a vacuum and direct thermal contact with a heater is not usually possible, as piezoelectric resonators are oversized in high stability crystal oscillators. However, the present invention may use any of the temperature stabilization techniques conventionally used to stabilize crystal oscillators, such as temperature compensation and ovenization.

(6) Magnetic Shielding

Magnetic shielding is an issue for any atomic-based frequency reference, since the hyperfine lines shift in an applied DC field. The resonator is enclosed in a soft magnetic material, which could be part of the packaging or integrated with the resonator and modulation coils. The shielding may be integrated into the sample module by depositing or printing the magnetic materials. In another embodiment, magnetic sensors, i.e. Hall effect sensors or a magnetoresistive film and additional coils or electrical lines are used to null the magnetic field.

At a given temperature and magnetic field, the hyperfine transition frequency is uniquely defined. The difference between this frequency and the measured frequency determines the error introduced by the electronic measurement system. In high-precision applications, feedback is used to calibrate out the frequency response of the measurement system, thereby minimizing the error in the determination of the actual frequency of the hyperfine transition.

(7) Other Variations (a) Paramagnetic Species Variations

In other embodiments, two dopants, or alternately, two lattices, or both, may be used to make a dual frequency standard. Generally, the frequency versus temperature of the spectrum of the two reference materials is different. The temperature at which these two reference frequencies have a simple relation to each other, e.g. one is an integer fraction of the other, and defines a unique frequency and temperature. The advantage over temperature regulation implemented by other means is the reduced sensitivity to the aging and accuracy of the sensor. Further, although crystal oscillators are used as high-sensitivity temperature sensors in several high-performance crystal oscillator implementations, these usually require a microprocessor and look up table, which is disadvantageous as far as integration, manufacturing and cost. In one embodiment, a unique relationship exists between the temperature and the frequency of the two hyperfine frequencies, which does not depend on manufacturing tolerances.

(b) Alternatives for the Electrical Resonator

In another embodiment, the electrical resonator may be replaced by a non-resonant transmission line; however, the sensitivity of the paramagnetic resonance measurement is reduced by approximately by the quality factor (Q) of the resonator.

What is claimed is:

1. A frequency standard comprising:
   a RF source having an RF signal output;
   RF circuitry coupled with the RF source, the RF circuitry having a solid dielectric which has an electron paramagnetic resonance and the RF circuitry proving a compared output signal; and
   feedback circuitry coupled with the RF circuitry and the RF source, the feedback circuitry proving an error signal,
   whereby the RF circuitry receives the RF signal output and compares the RF signal output to the electron paramagnetic resonance and generates a compared output signal, and the feedback circuitry receives the compared output signal and provides the error signal to the RF source and the RF source adjusts the RF signal output based on the error signal.

2. The frequency standard of claim 1, wherein the electron paramagnetic resonance is a zero-field electron paramagnetic resonance.

3. The frequency standard of claim 2, wherein the solid dielectric has metal ions and the metal ions have spin states, and wherein the zero-field electron paramagnetic resonance is formed via magnetic dipole transitions between the spin states of the metal ions in the solid dielectric.

4. The frequency standard of claim 3, wherein the magnetic dipole transitions are hyperfine transitions.

5. The frequency standard of claim 1, wherein the solid dielectric is vanadium doped magnesium oxide.

6. The frequency standard of claim 5, wherein the vanadium magnesium oxide is a single crystal or an amphorous crystal.

7. The frequency standard of claim 1, wherein the RF source is selected from the group comprising: a voltage-controlled oscillator or a frequency synthesizer.

8. The frequency standard of claim 1, wherein the RF circuitry comprises:
   a power divider coupled with the RF source having a first output and a second output;
   an electrical resonator having the solid dielectric and an output, the electrical resonator coupled with the second output of the power divider;
   a phase detector coupled with the first output of the power divider and the output of the electrical resonator,
   whereby the phase detector generates the compared output signal.

9. The frequency standard of claim 8, wherein the electrical resonator is selected from the group consisting of: a loop-gap resonator; a coaxial resonator and a toroidal resonator.

10. The frequency standard of claim 8, wherein the electrical resonator is a toroidal resonator comprising:
    an outer conductor; and
    a toroidal inductor within the outer conductor,
    wherein the solid dielectric makes up a portion of the toroidal inductor.

11. The frequency standard of claim 10, wherein the toroidal resonator further comprises modulation coils surrounding the toroidal inductor.

12. The frequency standard of claim 11, wherein the toroidal resonator further comprises a capacitive element coupled with the toroidal inductor.

13. The frequency standard of claim 12, wherein the capacitive element is formed from a top electrode and a bottom electrode coupled with the toroidal inductor.

14. The frequency standard of claim 8 further comprising modulation coils for applying a magnetic field to the solid dielectric, wherein the electron paramagnetic resonance transitions has frequencies, whereby the magnetic field modulates the frequencies of the electron paramagnetic resonance transitions.

15. The frequency standard of claim 14 further comprising a magnetic field modulation driver for controlling the magnetic field.

16. The frequency standard of claim 15, wherein the feedback circuitry comprises an audio demodulator for demodulating the modulation introduced by the magnetic field.

17. The frequency standard of claim 8, wherein the phase detector is a double-balanced mixer.

18. The frequency standard of claim 1, wherein the RF circuitry comprises:
    a power divider coupled with the RF source, the power divider having a first output port and a second output port;
    a circulator coupled with the second output port;

an electrical resonator having the solid dielectric, coupled with the circulator; and a phase detector coupled with the circulator and the first output port of the power divider.

19. The frequency standard of claim 1, wherein:

the RF source comprises:

RF oscillator circuitry; and an electrical resonator connected with the RF oscillator circuitry; and the RF circuitry comprises an envelope detector coupled with the electrical resonator and the feedback circuitry.

20. A method for obtaining a standard frequency comprising acts of:

receiving an RF signal;

comparing the RF signal to an electron paramagnetic resonance from a solid dielectric having paramagnetic species;

adjusting the RF signal to the electron paramagnetic resonance; and outputting the adjusted RF signal, whereby the adjusted RF signal is at a standard frequency determined by the electron paramagnetic resonance.

21. The method of claim 20, wherein the act of comparing includes an act of utilizing a zero-field electron paramagnetic resonance.

22. The method of claim 21, wherein the act of utilizing further comprises an act of generating magnetic dipole transitions between spin states of metal ions in the solid dielectric.

23. The method of claim 22, wherein the act of generating includes hyperfine transitions.

24. The method of claim 20, wherein the act of comparing further includes an act of comparing the RF signal to the electron paramagnetic resonance from a vanadium doped magnesium oxide solid dielectric.

25. The method of claim 24 further comprising an act of proving the vanadium doped magnesium oxide solid dielectric from a single crystal or an amphorous crystal.

26. The method of claim 20, wherein the act of comparing further includes acts of:

dividing the RF signal into a first RF signal and a second RF signal;

changing the second RF signal based upon the electron paramagnetic resonance and outputting a changed second RF signal; and generating an error signal based on the difference between the first RF signal and the changed second RF signal, wherein the error signal is used in the adjusting act.

27. The method of claim 26, wherein the act of changing the second RF signal is performed by an electrical resonator having the solid dielectric selected from the group consisting of: a loop-gap resonator; a coaxial resonator; and a toroidal resonator.

28. The method of claim 26, wherein the act of changing the second RF signal further comprises acts of:

forming a toroidal inductor from the solid dielectric having the electron paramagnetic resonance; and coupling the second RF signal into the toroidal inductor.

29. The method of claim 28, wherein the act of changing the second RF signal further comprises an act of modulating a magnetic field of the toroidal inductor.

30. The method of claim 29, wherein the act of changing the second RF signal further comprises an act of coupling a capacitive element with the toroidal inductor.

31. The method of claim 30, wherein the act of coupling further comprises an act of forming a top electrode and a bottom electrode attached with the toroidal inductor.

32. The method of claim 26 further comprising acts of:

applying a magnetic field to the solid dielectric; and modulating, via the magnetic field, frequencies of the electron paramagnetic resonance transitions in the solid dielectric.

33. The method of claim 32 further comprising an act of demodulating the modulation introduced by the magnetic field.

34. An apparatus comprising:

a RF source having an RF signal output;

RF circuitry coupled with the RF source, the RF circuitry having a solid dielectric which has a zero-field electron paramagnetic resonance and the RF circuitry proving a compared output signal; and feedback circuitry coupled with the RF circuitry and the RF source, the feedback circuitry proving an error signal, whereby the RF circuitry receives the RF signal output and compares the RF signal output to the zero-field electron paramagnetic resonance and generates a compared output signal, and the feedback circuitry receives the compared output signal and provides the error signal to the RF source and the RF source adjusts the RF signal based on the error signal, the RF source being locked to the zero-field electron paramagnetic resonance proving a standard frequency.

35. The apparatus of claim 34, wherein the wherein the solid dielectric has metal ions and the metal ions have spin states, and wherein the zero-field electron paramagnetic resonance is formed via magnetic dipole transitions between the spin states of the metal ions in the solid dielectric.

36. The apparatus of claim 35, wherein the magnetic dipole transitions are hyperfine transitions.

37. The apparatus of claim 34, wherein the solid dielectric is vanadium doped magnesium oxide.

38. The apparatus of claim 37, wherein the vanadium magnesium oxide is a single crystal or an amphorous crystal.

39. The apparatus of claim 34, wherein the RF source is selected from the group comprising: a voltage-controlled oscillator or a frequency synthesizer.

40. The apparatus of claim 34, wherein the RF circuitry comprises:

a power divider coupled with the RF source having a first output and a second output;

an electrical resonator having the solid dielectric and an output, the electrical resonator coupled with the second output of the power divider;

a phase detector coupled with the first output of the power divider and the output of the electrical resonator, whereby the phase detector generates the compared output signal.

41. The apparatus of claim 40, wherein the electrical resonator is selected from the group consisting of: a loop-gap resonator; a coaxial resonator and a toroidal resonator.

42. The apparatus of claim 40, wherein the electrical resonator is a toroidal resonator comprising:

an outer conductor; and a toroidal inductor within the outer conductor, wherein the solid dielectric makes up a portion of the toroidal inductor.

43. The apparatus of claim 42, wherein the toroidal resonator further comprises modulation coils surrounding the toroidal inductor.

44. The apparatus of claim 43, wherein the toroidal resonator further comprises a capacitive element coupled with the toroidal inductor.

45. The apparatus of claim 44, wherein the capacitive element is formed from a top electrode and a bottom electrode coupled with the toroidal inductor.

46. The apparatus of claim 40 further comprising modulation coils for applying a magnetic field to the solid dielectric, wherein the electron paramagnetic resonance transitions has frequencies, whereby the magnetic field modulates the frequencies of the electron paramagnetic resonance transitions.

47. The apparatus of claim 46 further comprising a magnetic field modulation driver for controlling the magnetic field.

48. The apparatus of claim 47, wherein the feedback circuitry comprises an audio demodulator for demodulating the modulation introduced by the magnetic field.

49. The apparatus of claim 40, wherein the phase detector is a double-balanced mixer.

50. The apparatus of claim 34, wherein the RF circuitry comprises:
 a power divider coupled with the RF source, the power divider having a first output port and a second output port;
 a circulator coupled with the second output port;
 an electrical resonator having a paramagnetic dielectric having a solid-state electron paramagnetic resonance, coupled with the circulator; and
 a phase detector coupled with the circulator and the first output port.

51. The apparatus of claim 34, wherein:
 the RF source comprises:
  RF oscillator circuitry; and
  an electrical resonator connected with the RF oscillator circuitry; and
 the RF circuitry comprise an envelope detector coupled with the electrical resonator and the feed-back circuitry.

52. A method for obtaining a frequency comprising acts of:
 receiving an RF signal;
 comparing the RF signal to a zero-field electron paramagnetic resonance from a solid dielectric having a paramagnetic species;
 adjusting the RF signal to the zero-field electron paramagnetic resonance; and
 outputting the adjusted RF signal,
 whereby the adjusted RF signal is at a standard frequency determined by the zero-field electron paramagnetic resonance.

53. The method of claim 52, wherein the act of comparing includes comparing the RF signal to the zero-field electron paramagnetic resonance formed from hyperfine transitions.

54. The method of claim 53, wherein the act of comparing further includes an act of comparing the RF signal to the electron paramagnetic resonance from a vanadium doped magnesium oxide solid dielectric.

55. The method of claim 54 further comprising an act of proving the vanadium doped magnesium oxide solid dielectric from a single crystal or an amphorous crystal.

56. The method of claim 52, wherein the act of comparing further includes acts of:
 dividing the RF signal into a first RF signal and a second RF signal;
 changing the second RF signal based upon the zero-field electron paramagnetic resonance and outputting a changed second RF signal; and
 generating an error signal based on the difference between the first RF signal and the changed second RF signal,
 wherein the error signal is used in the adjusting act.

57. The method of claim 56, wherein the act of changing the second RF signal is performed by an electrical resonator having the solid dielectric selected from the group consisting of: a loop-gap resonator; a coaxial resonator; and a toroidal resonator.

58. The method of claim 56, wherein the act of changing the second RF signal further comprises acts of:
 forming a toroidal inductor from the solid dielectric having the zero-field electron paramagnetic resonance; and
 coupling the second RF signal into the toroidal inductor.

59. The method of claim 58, wherein the act of changing the second RF signal further comprises an act of modulating a magnetic field of the toroidal inductor.

60. The method of claim 59, wherein the act of changing the second RF signal further comprises an act of coupling a capacitive element with the toroidal inductor.

61. The method of claim 60, wherein the act of coupling further comprises an act of forming a top electrode and a bottom electrode attached with the toroidal inductor.

62. The method of claim 56 further comprising acts of:
 applying a magnetic field to the solid dielectric; and
 modulating, via the magnetic field, frequencies of the electron paramagnetic resonance transitions in the solid dielectric.

63. The method of claim 62 further comprising an act of demodulating the modulation introduced by the magnetic field.

* * * * *